(12) United States Patent
Kitamura et al.

(10) Patent No.: US 6,441,539 B1
(45) Date of Patent: Aug. 27, 2002

(54) PIEZOELECTRIC RESONATOR

(75) Inventors: Hidekazu Kitamura, Takefu; Kazuhiro Inoue, Moriyama; Masaki Takeuchi, Shiga-ken, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/706,603

(22) Filed: Nov. 6, 2000

(30) Foreign Application Priority Data

| Nov. 11, 1999 | (JP) | 11-321587 |
| Nov. 17, 1999 | (JP) | 11-327181 |
| Aug. 24, 2000 | (JP) | 2000-253661 |
| Sep. 19, 2000 | (JP) | 2000-283724 |

(51) Int. Cl.$^7$ .......................... H01L 24/82; H01L 41/04
(52) U.S. Cl. .................................. 310/346; 310/321
(58) Field of Search ................. 310/324, 346, 310/321; H03H 2/17; H01L 41/04, 45/04

(56) References Cited

U.S. PATENT DOCUMENTS

| 3,505,572 A | * | 4/1970 | Yamashita | 257/416 |
| 4,456,850 A | * | 6/1984 | Inoue | 310/346 |
| 4,642,508 A |   | 2/1987 | Suzuki et al. | |
| 5,446,306 A | * | 8/1995 | Stokes et al. | 310/321 |
| 5,494,251 A | * | 2/1996 | Taguchi | 310/346 |
| 5,894,251 A | * | 4/1999 | Taguchi et al. | 310/313 B |
| 6,204,737 B1 | * | 3/2001 | Ella | 310/321 |

FOREIGN PATENT DOCUMENTS

| EP | 1 047 189 A2 | 10/2000 | |
| JP | 5812815 | * 7/1983 | H03H/3/04 |
| JP | 2000-165188 | * 6/2000 | H03H/9/17 |

\* cited by examiner

Primary Examiner—Nestor Ramirez
Assistant Examiner—Karen Addison
(74) Attorney, Agent, or Firm—Keating & Bennett, LLP

(57) ABSTRACT

A piezoelectric resonator includes a laminated structure having a piezoelectric laminate, at least one pair of electrodes and a substrate. The piezoelectric laminate includes at least one first piezoelectric layer having a positive temperature coefficient of a resonant frequency and at least one second piezoelectric layer which has a negative temperature coefficient of a resonant frequency. The at least one pair of electrodes interpose at least one of the first and second piezoelectric layers. The substrate supports the laminated structure and holds a portion of the laminated structure such that a suspended portion of the laminated structure vibrates in response to application of a voltage across the pair of electrodes.

20 Claims, 26 Drawing Sheets

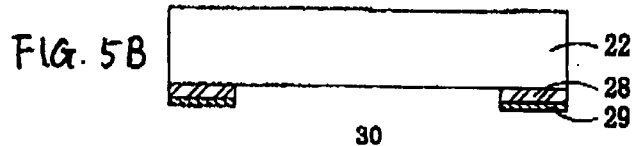
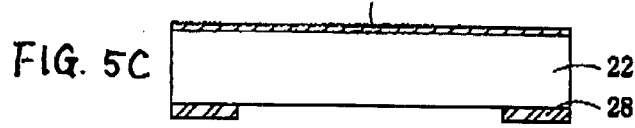
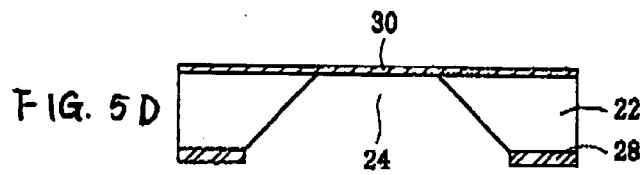
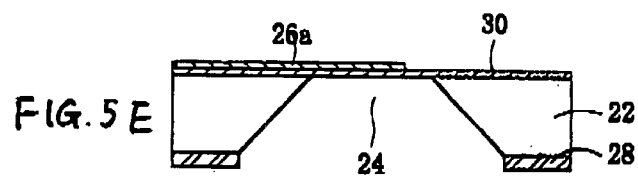
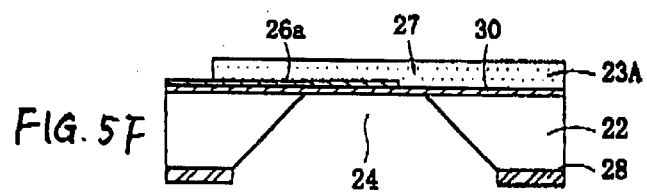
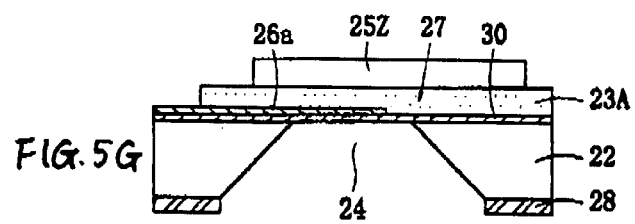
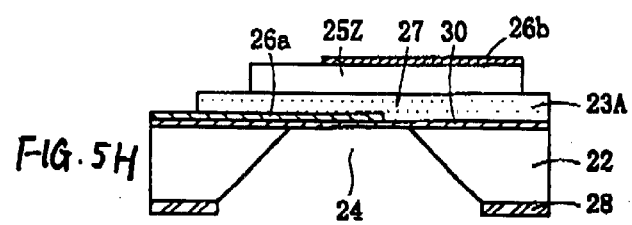
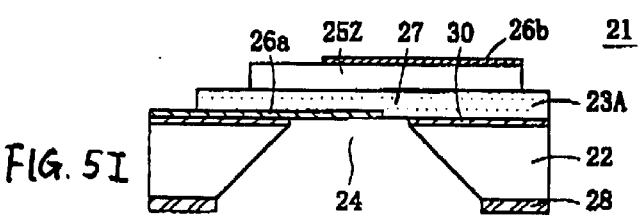

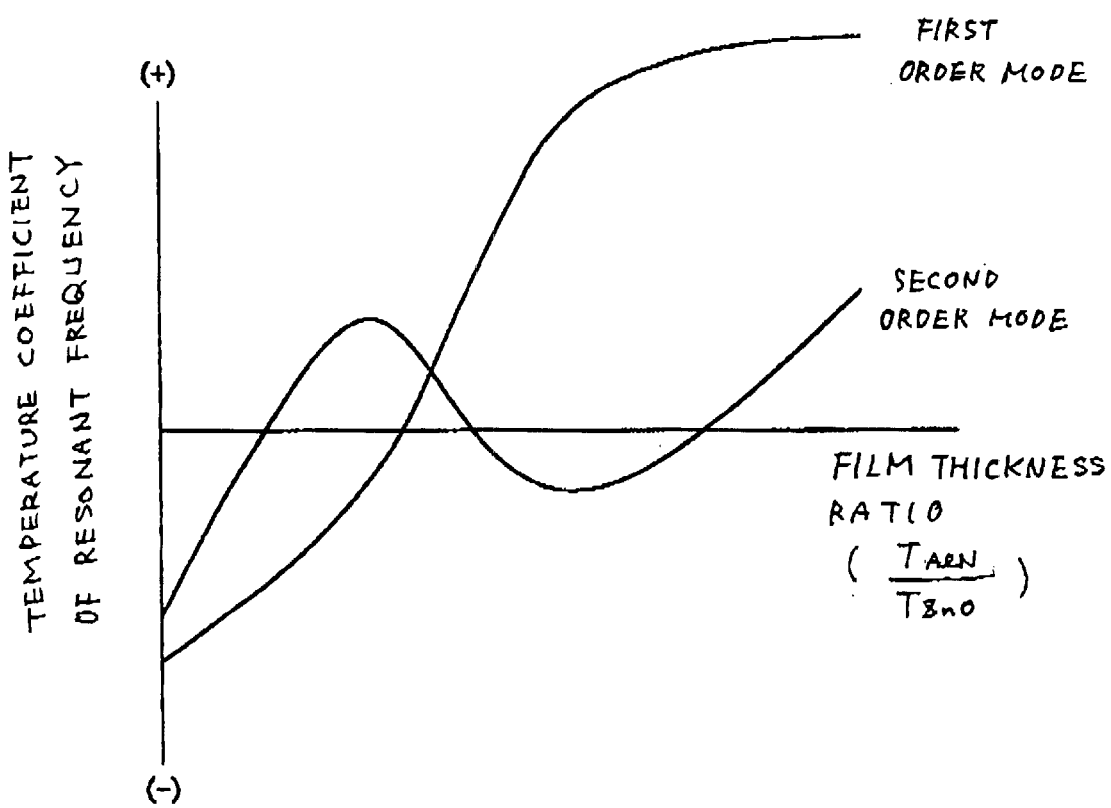

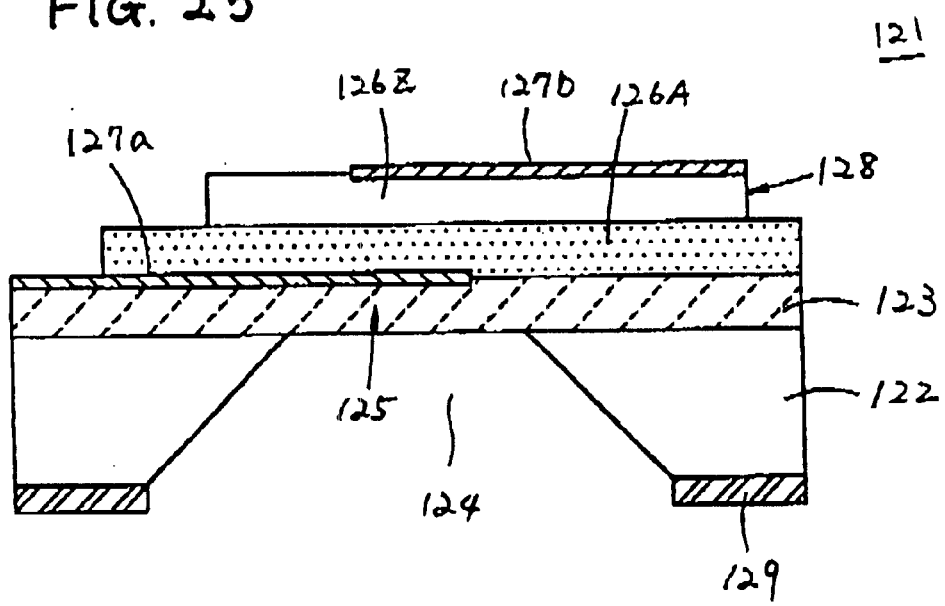

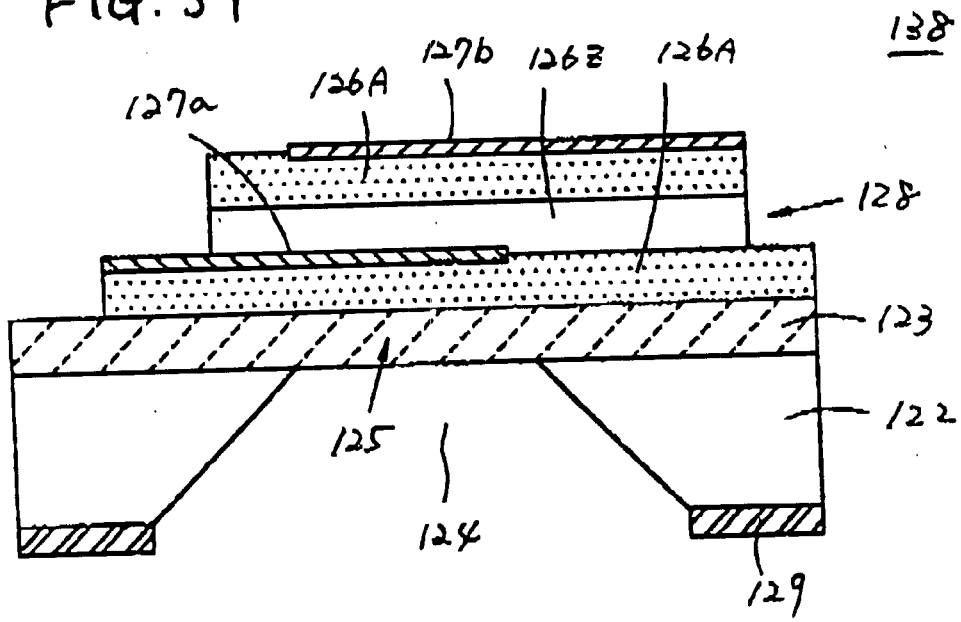
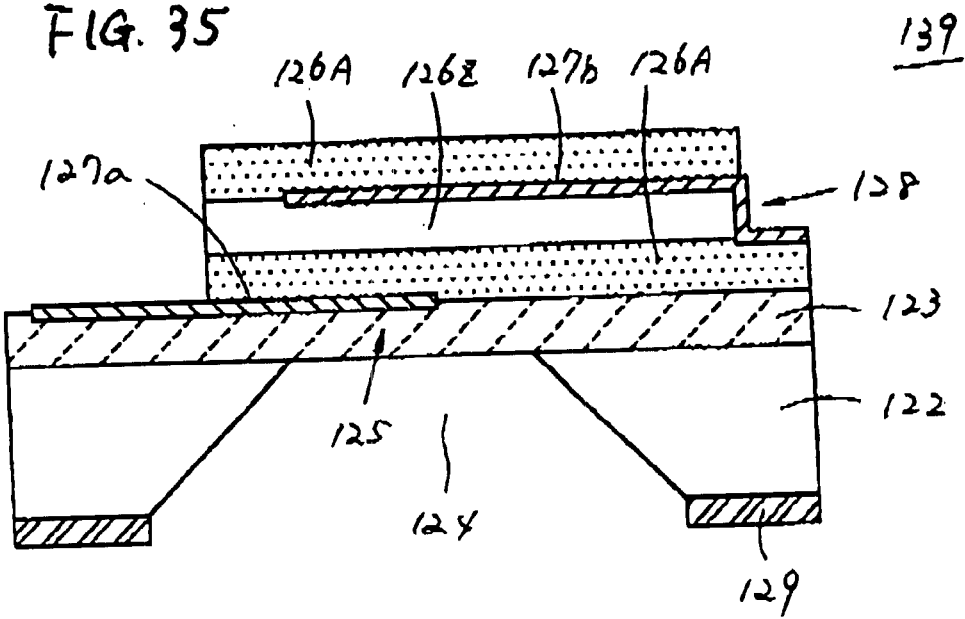

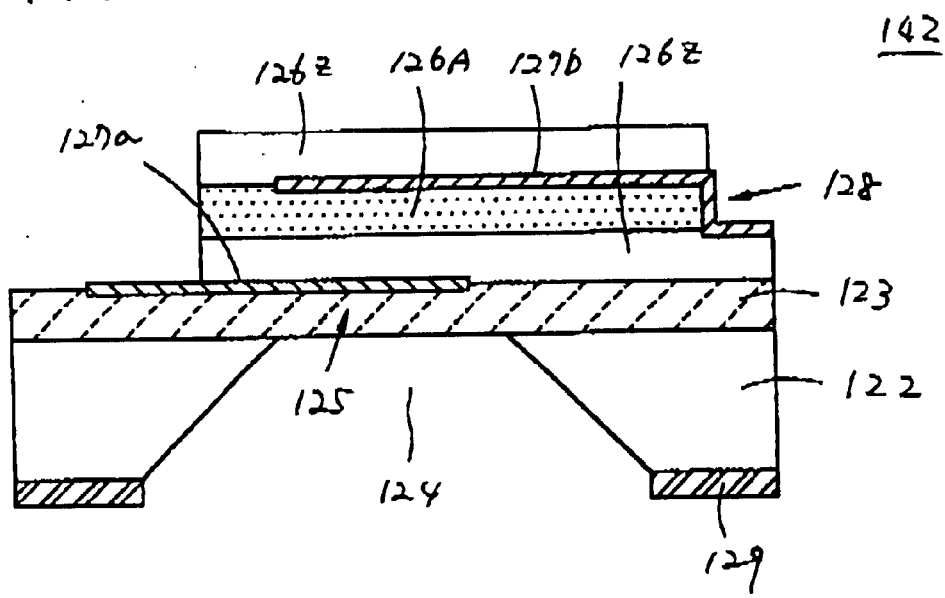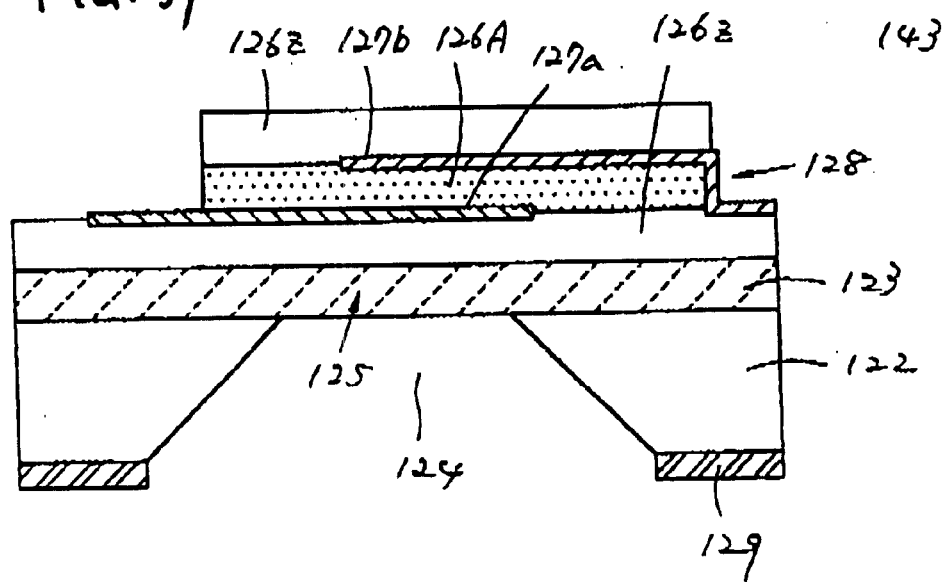

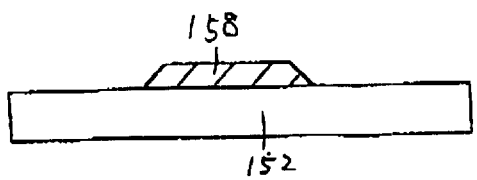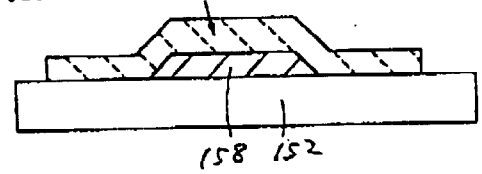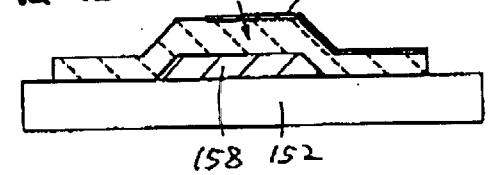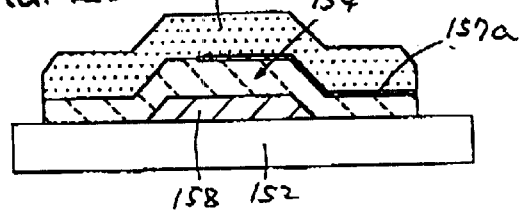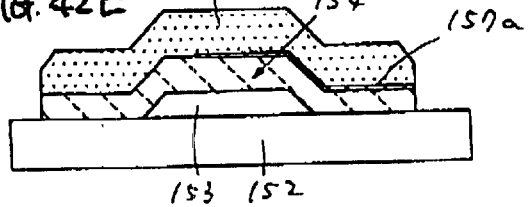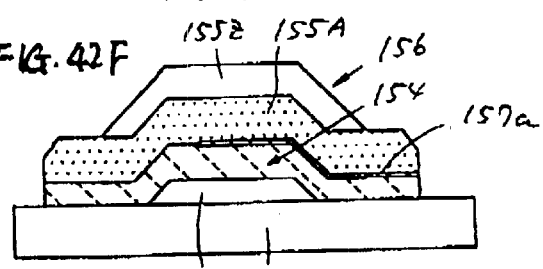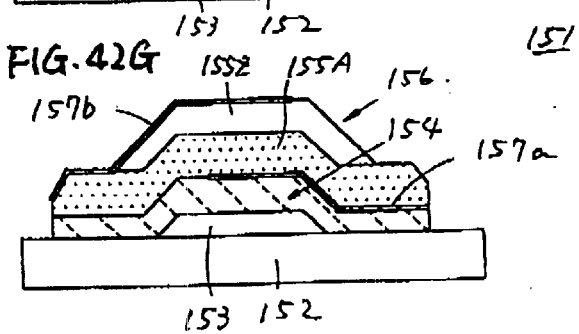

PIEZOELECTRIC RESONATOR

BACKGROUND OF THE INVENTION

1. Field of the Invention

The present invention relates to piezoelectric resonators, and more specifically, the present invention relates to piezoelectric resonators, filters and electronic apparatuses utilizing the elastic vibration of piezoelectric layers.

2. Description of the Related Art

Resonant frequencies of piezoelectric thin film resonators that are adapted to utilize the thickness mode vibration of piezoelectric substrates, have an inverse proportional relationship relative to the thickness of the piezoelectric substrates, in very high frequencies. Therefore, piezoelectric substrates included in such piezoelectric resonators must be extremely thin. However, there is a limit to how think the piezoelectric substrates can be. In most piezoelectric resonators of this type, there is a limit of several 100 MHz of high frequencies in practice due to restrictions in the mechanical strength, treatment steps, manufacturing processes and other factors relating to the piezoelectric substrates.

To solve these problems, piezoelectric thin film resonators have been proposed as filters and resonators, etc. The piezoelectric thin film resonator 1 shown in FIG. 1, is manufactured by partially etching a Si substrate 2 using a fine processing method to form a thin film support portion 3, having a thickness of several $\mu$m or less, on a portion of the Si substrate 2, and by providing a ZnO piezoelectric thin film 4, having a pair of excitation electrodes 5a and 5b on both sides, on the support portion 3.

The aforementioned piezoelectric thin film resonator 1 has a possibility to extend its high frequency characteristics to as high as several 100 MHz to several 1000 MHz, because the thin film support portion 3 can be made thin, using the fine processing technique, and the piezoelectric thin film 4 can also be made thin by sputtering.

However, a temperature coefficient of resonant frequency (TCF) of ZnO is about −70 ppm/° C., and a temperature coefficient of resonant frequency of Si is about −30 ppm/° C. Both ZnO and Si have negative temperature coefficients of resonant frequency, and, therefore, a combination of the piezoelectric thin film 4, made of ZnO, and the thin film support portion 3, made of Si, has the disadvantage that temperature characteristics of resonant frequency in the dominant mode become inferior.

In a piezoelectric thin film resonator 6, shown in FIG. 2, an $SiO_2$ thin film 7 is formed on the surface of an Si substrate 2 by thermal oxidation. A thin film support portion 3 is formed from the $SiO_2$ thin film 7 by partially etching the Si substrate 2, and a ZnO piezoelectric thin film 4, having a pair of excitation electrodes 5a and 5b on both sides, is formed on the support portion 3.

A temperature coefficient of resonant frequency of ZnO is about −70 ppm/° C., and a temperature coefficient of resonant frequency of $SiO_2$ is about +100 ppm/° C. ZnO and $SiO_2$ have temperature coefficients of resonant frequency having opposite signs from each other. By adjusting a ratio of a film thickness of the piezoelectric thin film 4, made of ZnO, to a film thickness of the thin film support portion 3, made of $SiO_2$, at a ratio of about 2:1, it is possible to make the temperature coefficient of resonant frequency, in the dominant mode, small, and to make the temperature characteristics of resonant frequency stable. This is described in Japanese Unexamined Patent Application Publication No. 58-121817.

FIG. 3 is a sectional view illustrating a piezoelectric thin film resonator 9 having another structure. This is the piezoelectric thin film resonator 9, having a floating construction or air bridge construction, manufactured by forming a thin film support portion 12, made of $SiO_2$, on a Si substrate 10 via an air gap 11, and providing a ZnO piezoelectric thin film 13, having excitation electrodes 14a and 14b on both sides, on the support portion 12 that is arranged to be free from the Si substrate 10.

In the piezoelectric thin film resonator 9, similarly to the piezoelectric thin film resonator 6 shown in FIG. 2, by adjusting a ratio of a film thickness of the ZnO piezoelectric thin film to a film thickness of the $SiO_2$ thin film support portion 12 at a proper value, it is possible to make the temperature coefficient of resonant frequency small and to make the temperature characteristics of resonant frequency stable.

In the aforementioned second piezoelectric thin film resonator 6, by a combination of the ZnO piezoelectric thin film 4 and the $SiO_2$ thin film support portion 3, temperature coefficients of resonant frequency can offset each other. In the aforementioned third piezoelectric thin film resonator 9, by a combination of the ZnO piezoelectric thin film 13 and the $SiO_2$ thin film support portion 12, temperature coefficients of resonant frequency can offset each other.

However, ZnO is a piezoelectric, whereas $SiO_2$ is not a piezoelectric. Therefore, in these piezoelectric thin film resonators, resonant responses have been very small and resonant characteristics have been inferior.

SUMMARY OF THE INVENTION

In order to overcome and solve the above-described problems, preferred embodiments of the present invention provide piezoelectric resonators having a very stable temperature coefficient of resonant frequency, a very large resonant response, and excellent resonant characteristics.

According to one preferred embodiment of the present invention, a piezoelectric resonator includes a laminated member, at least one pair of electrodes and a substrate. The laminated member includes a piezoelectric laminate body, the piezoelectric laminate body including at least one first piezoelectric layer which has a positive temperature coefficient of a resonant frequency and at least one second piezoelectric layer which has a negative temperature coefficient of a resonant frequency. The pair of electrodes interpose at least one of the first and second piezoelectric layers. The substrate supports the laminated member and holds a support portion of the laminated member such that the support portion vibrates in response to application of a voltage across the pair of electrodes.

According to the structure, by properly adjusting the thickness of each piezoelectric layer, the temperature coefficient of resonant frequency of the entire laminate member becomes nearly zero. Furthermore, because all layers except for electrodes are made of piezoelectric materials, the resonant response of the piezoelectric resonator is excellent, and the resonant characteristics are also excellent. Therefore, piezoelectric resonators, having very stable temperature characteristics, very large resonant responses, and excellent resonant characteristics, are provided.

The laminated structure may also include an insulating layer located between the substrate and the piezoelectric laminate.

According to such a structure, the insulator layer is disposed on the substrate, and because, generally, insulator layers are difficult to be etched with etching liquids used for substrates and layers intended to be etched, the processing in the manufacturing procedures is much easier.

Furthermore, because the insulating layer, and two or more kinds of piezoelectric layers are laminated on the substrate, material parameters of the vibration portion become three or more, and it becomes possible to easily and accurately adjust electromechanical coefficients and piezoelectric characteristics.

Therefore, it is possible to stabilize temperature coefficients of resonant frequency, to greatly increase resonant responses, to achieve excellent resonant characteristics, to greatly simplify the etching process for floating the insulation layer above the substrate, and to greatly increase the design flexibility for other characteristics.

The pair of electrodes may interpose the at least one first piezoelectric layer and the at least one second piezoelectric layer.

According to this unique structure, by applying an electric signal for excitation to the electrodes, all piezoelectric layers can be excited. Therefore, resonant responses of piezoelectric resonators are greatly increased and made very large, and the resultant piezoelectric resonators having very strong and desirable resonant characteristics.

The first piezoelectric layer is preferably made of, as a primary component, one of AlN and $PbZr_xTi_{(1-x)}O_3$ ($0.54 \leq x \leq 1$), and the second piezoelectric layer is preferably made of, as a primary component, one piezoelectric material selected from the group consisting of ZnO, $LiNbO_3$, $LiTaO_3$, and $PbZr_xTi_{(1-x)}O_3$ ($0 \leq x \leq 0.52$).

The piezoelectric laminate may include additional first or second piezoelectric layers. In such a case, the additional first or second piezoelectric layers and the at least one first or second piezoelectric layer have substantially the same thickness and interpose the at least second or first piezoelectric layer.

According to the unique structure of this preferred embodiment, the piezoelectric laminate member preferably includes three piezoelectric layers and is symmetric with respect to the center layer. As a result, even if stress is applied in each piezoelectric layer due to temperature change, the stresses are balanced, thereby realizing a piezoelectric resonator that has a very high mechanical strength and does not experience warpage.

For the purpose of illustrating the invention, there is shown in the drawings several forms which are presently preferred, it being understood, however, that the invention is not limited to the precise arrangements and instrumentalities shown.

Other features, elements, characteristics and advantages of the present invention will become more apparent from the following detailed description of preferred embodiments thereof, with reference to the attached drawings.

BRIEF DESCRIPTION OF THE DRAWINGS

FIGS. 5A to 5I are figures illustrating a method of manufacturing the piezoelectric thin film resonator shown in FIG. 4.

FIG. 6 is a figure illustrating a relationship of a film thickness ratio of piezoelectric thin films and thin film support portions, and temperature coefficients of resonant frequency in piezoelectric thin film resonators.

FIG. 25 is a sectional view of a piezoelectric thin film resonator according to a nineteenth preferred embodiment of the present invention.

FIG. 34 is a sectional view of a piezoelectric thin film resonator according to a twenty-seventh preferred embodiment of the present invention.

FIG. 35 is a sectional view of a piezoelectric thin film resonator according to a twenty-eighth preferred embodiment of the present invention.

FIG. 38 is a sectional view of a piezoelectric thin film resonator according to a thirty-first preferred embodiment of the present invention.

FIG. 39 is a sectional view of a piezoelectric thin film resonator according to a thirty-second preferred embodiment of the present invention.

FIGS. 42A to 42G are figures illustrating a method of manufacturing the piezoelectric thin film resonator shown in FIG. 41.

DETAILED DESCRIPTION OF PREFERRED EMBODIMENTS

Hereinafter, preferred embodiments of the present invention are explained in detail with reference to the drawings.

Figure 1:
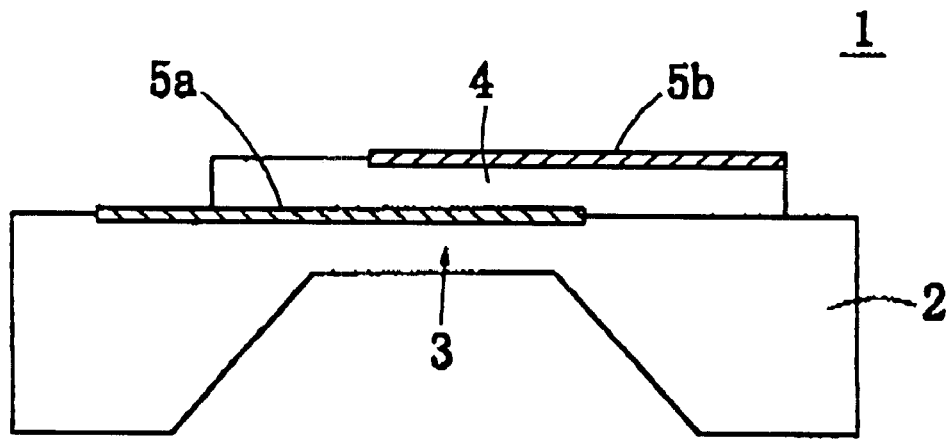
FIG. 1 is a sectional view illustrating a structure of a conventional piezoelectric thin film resonator.
Figure 2:
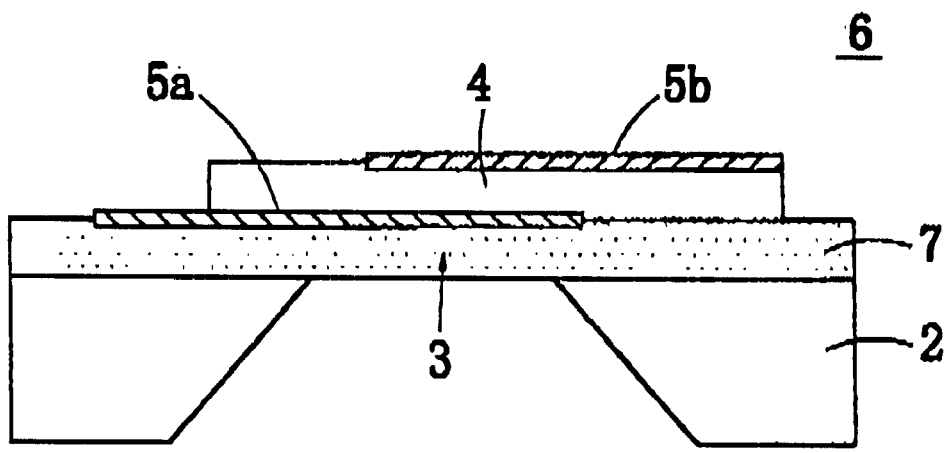
FIG. 2 is a sectional view illustrating a structure of another conventional piezoelectric thin film resonator having an improved temperature coefficient of resonant frequency.
Figure 3:
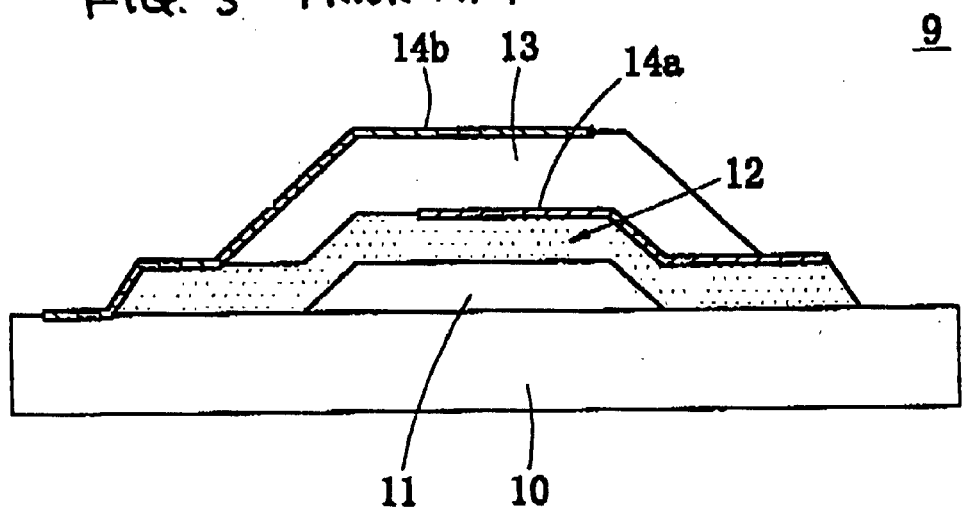
FIG. 3 is a sectional view illustrating a structure of another conventional piezoelectric thin film resonator having a floating construction.
Figure 4:
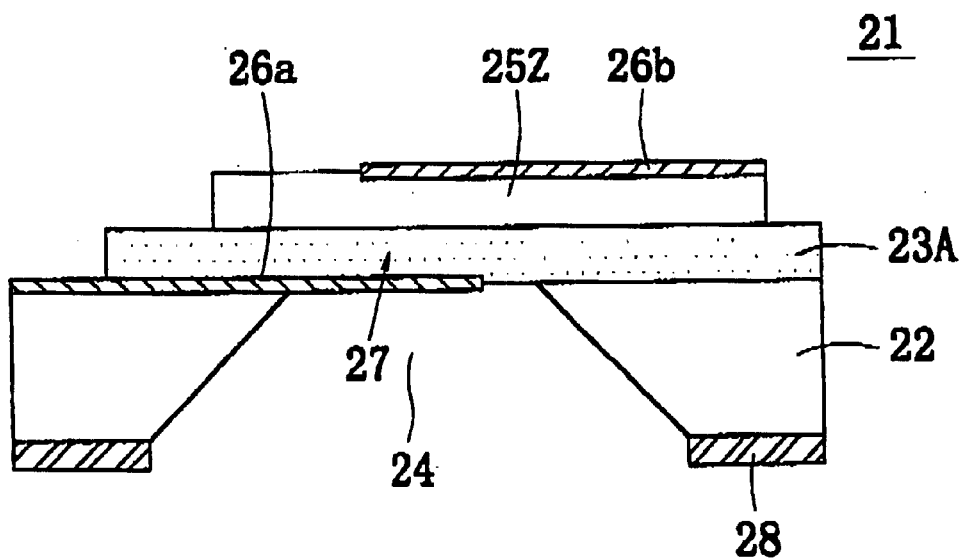
FIG. 4 is a sectional view of a piezoelectric thin film resonator according to a first preferred embodiment of the present invention.

FIG. 4 is a sectional view illustrating a structure of a piezoelectric thin film resonator 21 according to a first preferred embodiment of the present invention. In the piezoelectric thin film resonator 21, an AlN thin film 23A is disposed on the upper surface of an Si substrate 22, and the approximately central portion of the Si substrate 22 is opened to make a cavity 24. That is, the Si substrate 22 has an opening defining the cavity 24 and has a substantially frame-shape configuration. A portion of the AlN thin film 23A corresponding to the cavity 24 is referred to as a thin film support portion 27. A $SiO_2$ film 28 is disposed on a lower surface of the Si substrate 22. A piezoelectric thin film 25Z, preferably made of ZnO, is disposed on an upper surface of the thin film support portion 27, thereby forming a piezoelectric laminate member which includes the AlN thin film 23A and the piezoelectric thin film 25Z.

Since the Si substrate 22 has a substantially frame-shaped configuration, a portion of the piezoelectric laminate located over the cavity 24 is suspended in the air by the Si substrate 22, so that this suspended portion, which may be referred to as a vibration portion, can vibrate.

One excitation electrode 26a is arranged on a lower surface of the AlN thin film 23A so as to extend toward an end portion of the Si substrate 22, and a portion of the excitation electrode 26a is exposed out of the AlN thin film 23A. Another excitation electrode 26b is provided on an upper surface of the piezoelectric thin film 25Z.

Thus, excitation electrodes 26a and 26b are provided on both sides of the vibration portion of a piezoelectric laminate. Therefore, the vibration portion vibrates in a thickness mode in response to an electric signal for excitation being applied.

FIGS. 5A to 5I are figures illustrating a method of manufacturing the aforementioned piezoelectric thin film resonator 21. It is not shown in FIG. 4, but the etching of the Si substrate 22 is controlled by a $SiO_2$ film 30, which is located on an upper surface of the Si substrate 22, as follows. A (100) plane Si substrate 22 is prepared, and a $SiO_2$ film 28 is formed on a lower surface of the Si substrate 22 by sputtering or other suitable process. Then, a resist film 29 is formed on the $SiO_2$ film 28, and, using photolithography, the resist film 29 is patterned to make an opening, which is show in FIG. 5A. As seen in FIG. 5B, through the opening of the resist film 29, the $SiO_2$ film 28 is selectively etched with hydrofluoric acid, or other suitable etchant, to form an opening in the $SiO_2$ film 28, which opening is adjusted according to the opening of the resist film.

After removing the resist film 29, which is formed on the lower surface of the Si substrate 22, a $SiO_2$ film 30 is formed on the surface of the Si substrate 22, by a CVD method, a sputtering method, or other suitable method, as seen in FIG. 5C. Thereafter, using the $SiO_2$ film 30 as a mask, the Si substrate 22 is anisotropically etched with an etching liquid, such as TMAH, from the lower surface. As a result of the anisotropic etching, the approximately center portion of the Si substrate 22 is opened, and a cavity 24 is formed under the $SiO_2$ film 30, as seen in FIG. 5D. Accordingly, the areas surrounding the $SiO_2$ film 30 are supported by the Si substrate 22, and the approximately center portion of the $SiO_2$ film 30 is arranged to be free from the Si substrate 22 on the cavity 24.

Then, an electrode material is deposited on the surface of the $SiO_2$ film 30, preferably by a lift-off vapor deposition method, to form one excitation electrode 26a, as seen in FIG. 5E. An AlN thin film 23A is formed on the surface of the $SiO_2$ film 30 preferably by reactive sputtering from above the excitation electrode 26a, as seen in FIG. 5F. At this time, a portion of the excitation electrode 26a is exposed from the AlN thin film 23A.

Then, ZnO is deposited, preferably by reactive sputtering using a metal mask, to form a ZnO piezoelectric thin film 25Z on the AlN thin film 23A, as seen in FIG. 5G. Furthermore, the electrode material is deposited on the ZnO piezoelectric thin film 25Z, preferably by a lift-off vapor deposition method, to form the other excitation electrode 26b, as seen in FIG. 5H. An exposed portion of the $SiO_2$ film 30 is removed, preferably by a wet etching with HF series etchants, and dry etching with RIE, or other suitable material and method, to expose the excitation electrode 26a and the lower surface of the $SiO_2$ film 30, as seen in FIG. 5I. Thus, the piezoelectric thin film resonator 21, having a structure shown in FIG. 4, is manufactured.

As a result, the temperature coefficient of resonant frequency of ZnO has a negative value, the temperature coefficient of resonant frequency of AlN has a positive value. Therefore, in the piezoelectric thin film resonator 21, which is formed as described above by uniting the ZnO piezoelectric thin film 25Z and the AlN thin film support portion 27, the temperature coefficient of resonant frequency becomes nearly zero by properly adjusting a film thickness ratio of the ZnO piezoelectric thin film 25Z and the thin film support portion 27.

FIG. 6 shows changes of temperature coefficients of resonant frequency of the piezoelectric thin film resonator 21 with changes of the ratio of the film thickness of AlN thin film support portion, $T_{AlN}$, to the film thickness of ZnO piezoelectric thin film 25Z, $T_{ZnO}$, or ($T_{AlN}/T_{ZnO}$). From experimental data, the most suitable film thickness ratio can be determined, and the temperature coefficient of resonant frequency of the piezoelectric thin film resonator 21 is determined to be nearly zero.

Furthermore, in conventional piezoelectric thin film resonators, thin film support portions only function to support the piezoelectric thin films, which are to be piezoelectrically vibrated. In contrast, in the piezoelectric thin film resonator 21 of this preferred embodiment of the present invention, because ZnO, constituting the ZnO piezoelectric thin film 25Z, and the thin film support portion 27 are both piezoelectric materials, when an electric signal is applied to the ZnO piezoelectric thin film 25Z and the thin film support portion 27 via the excitation electrodes 26a and 26b, elastic vibrations (thickness mode vibrations) are generated in both of the thin film support portion 27 and the ZnO piezoelectric thin film 25Z, then, a large resonant response is obtained and strong resonant characteristics are achieved.

Figure 7:
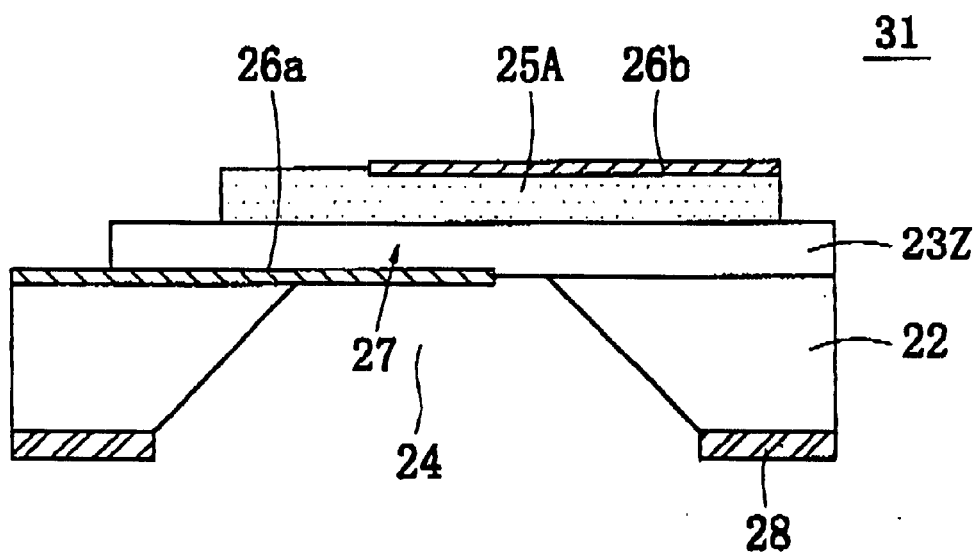
FIG. 7 is a sectional view of a piezoelectric thin film resonator according to a second preferred embodiment of the present invention.

FIG. 7 is a sectional view of a piezoelectric thin film resonator 31 according to a second preferred embodiment of the present invention. In the piezoelectric thin film resonator 31, a ZnO thin film 23Z is provided on an upper surface of a Si substrate 22, and a cavity 24 is made in the approximate central portion of the Si substrate 22. An AlN piezoelectric thin film 25A is provided on the ZnO thin film 23Z. Excitation electrodes 26a and 26b are disposed, respectively, on an upper surface and a lower surface of a vibration portion, preferably made of a laminate of the AlN piezoelectric thin film 25A and the thin film support portion 27.

Because the piezoelectric thin film resonator 31 corresponds to the resonator in the first preferred embodiment, wherein piezoelectric materials of the thin film support portion and ZnO piezoelectric thin film are exchanged with each other, similarly to the first preferred embodiment, the temperature coefficient of resonant frequency becomes stable by properly adjusting the film thickness of the thin film support portion 27, and the film thickness of the AlN piezoelectric thin film 25A. Furthermore, the thin film support portion 27 and AlN piezoelectric thin film 25A are both piezoelectrically vibrated, so that it is possible to greatly increase the resonant impedance of the piezoelectric thin film resonator 31, and to obtain very strong resonant characteristics.

Figure 8:
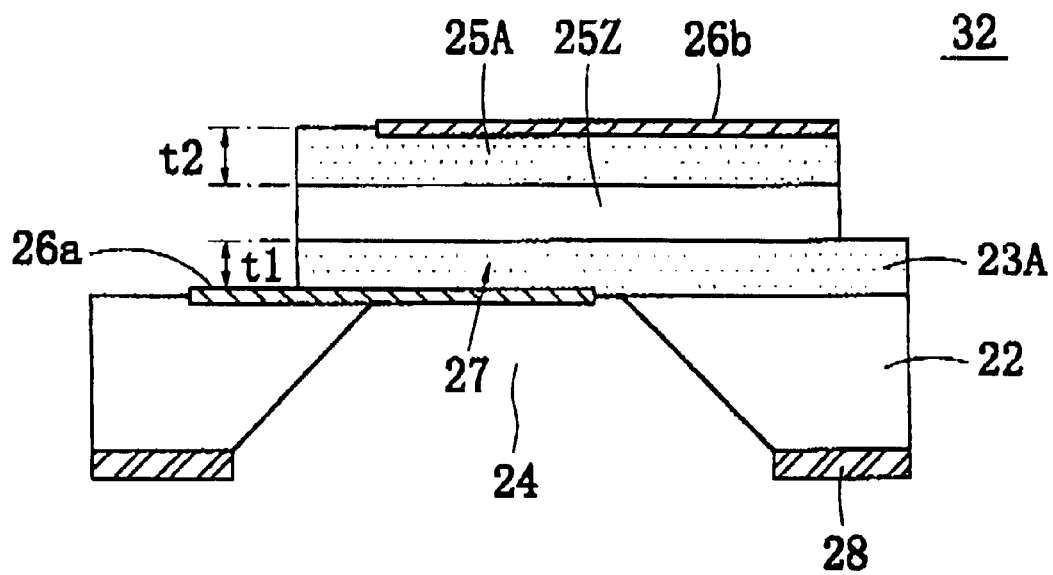
FIG. 8 is a sectional view of a piezoelectric thin film resonator according to a third preferred embodiment of the present invention.

FIG. 8 is a sectional view of a piezoelectric thin film resonator 32 according to a third preferred embodiment of the present invention. In the piezoelectric thin film resonator 32, an AlN thin film 23A is disposed on a Si substrate 22, and a cavity 24 is made in the approximately central portion of the Si substrate 22 by the anisotropic etching, and an AlN piezoelectric thin film 25A is further provided thereon. Excitation electrodes 26a and 26b are disposed, respectively, on an upper surface and a lower surface of a vibration portion, preferably made of a laminate of the AlN piezoelectric thin film 25A, a ZnO piezoelectric thin film 25z, and a thin film support portion 27.

The piezoelectric thin film resonator 32 is also manufactured in a manner similar to the first preferred embodiment, except that, after forming the ZnO piezoelectric thin film 25Z, by the reactive sputtering using a metal mask, the AlN piezoelectric thin film 25A is formed by the reactive sputtering using a metal mask.

In such a laminate having a three-layered structure, by properly adjusting each ratio of film thickness of the thin film support portion 27, the ZnO piezoelectric thin film 25Z, and the AlN piezoelectric thin film 25A, the temperature coefficient of resonant frequency is nearly zero, and the temperature characteristics are made very stable.

Furthermore, because the entire laminate member including three layers of piezoelectric thin films, 23A, 25Z, and 25A, is made of piezoelectric materials, when an electric signal is applied to the piezoelectric thin films 25A and 25Z, and the thin film support portion 27 via the excitation electrodes 26a and 26b, elastic vibrations are generated in all of the thin film support portion 27, and the piezoelectric thin films 25Z and 25A, then, a very large resonant response is obtained and very strong resonant characteristics are achieved.

In the piezoelectric thin film resonator 32 having such a unique structure, when the film thickness of the thin film support portion 27 and the film thickness of the AlN piezoelectric thin film 25A are equalized, the top and bottom structures of the laminate become nearly symmetric each other, then mechanical warps in the laminate, due to temperature changes, are prevented from occurring.

Figure 9:
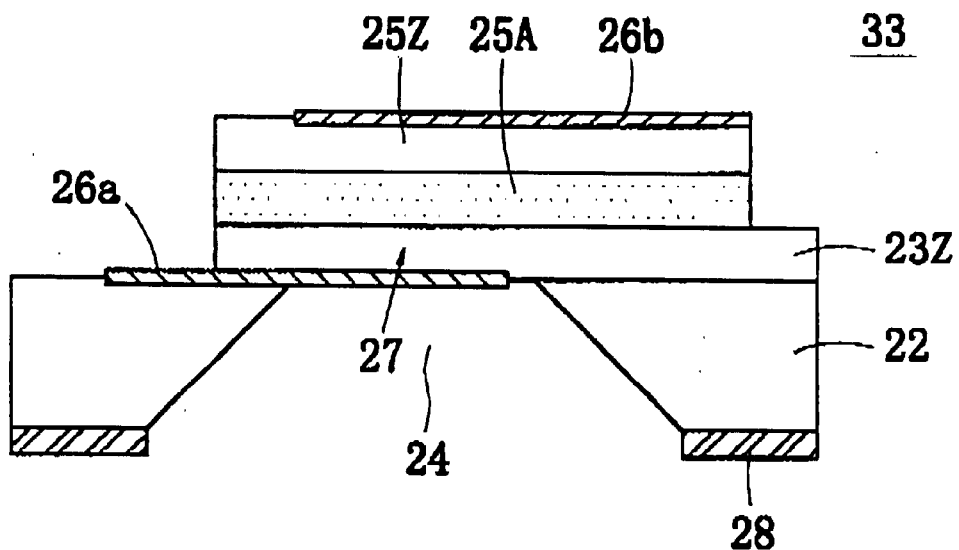
FIG. 9 is a sectional view of a piezoelectric thin film resonator according to a fourth preferred embodiment of the present invention.

FIG. 9 is a sectional view of a piezoelectric thin film resonator 33 according to a fourth preferred embodiment of the present invention. In the piezoelectric thin film resonator 33, a ZnO thin film 23Z is provided on an upper surface of a Si substrate 22, and a cavity 24 is provided in the approximately central portion of the Si substrate 22. An AlN piezoelectric thin film 25A is disposed on a ZnO thin film 23Z, and furthermore, a ZnO piezoelectric thin film 25Z is disposed thereon. Excitation electrodes 26b and 26a are respectively located on an upper surface and a lower surface of a vibration portion, which is preferably made of a laminate of the ZnO piezoelectric thin film 25Z, the AlN piezoelectric thin film 25A, and the thin film support portion 27.

Because the piezoelectric thin film resonator 33 corresponds to the piezoelectric thin film resonator 32 in the third preferred embodiment, wherein piezoelectric materials of the thin film support portion 27, the ZnO piezoelectric thin film 25Z, and the AlN piezoelectric thin film 25A are exchanged, similarly to the third preferred embodiment, the temperature coefficient of resonant frequency becomes very stable by properly adjusting the film thickness of the thin film support portion 27 and the film thickness of each piezoelectric thin film 25A and 25Z. Furthermore, the thin film support portion 27 and each piezoelectric thin film 25A and 25Z are piezoelectrically vibrated so as to greatly increase the resonant response of the piezoelectric thin film resonator 33, and to obtain very strong resonant characteristics. By making the top and bottom structures of the laminate nearly symmetric each other, mechanical warps in the laminate caused by temperature changes or other environmental factors are prevented from occurring.

Figure 10:
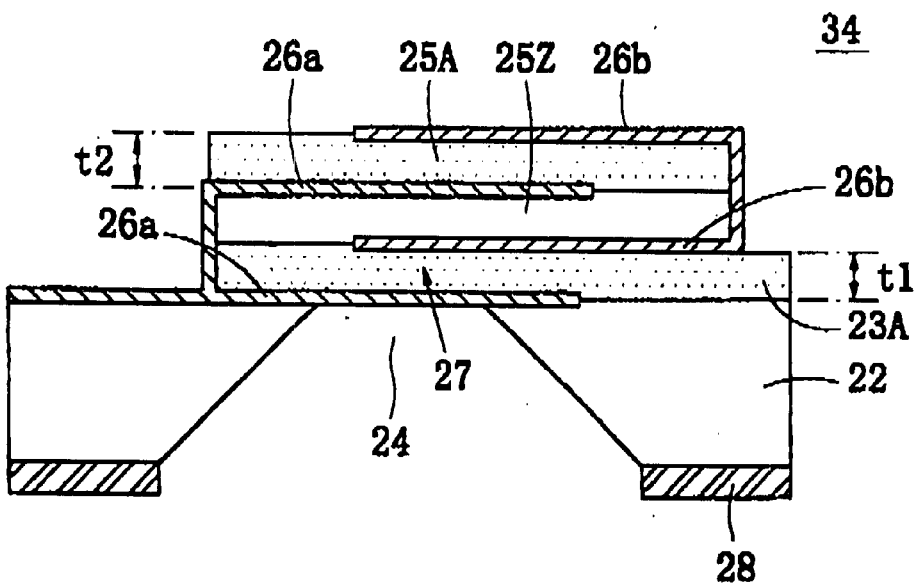
FIG. 10 is a sectional view of a piezoelectric thin film resonator according to a fifth preferred embodiment of the present invention.

FIG. 10 is a sectional view of a piezoelectric thin film resonator 34 according to a fifth preferred embodiment of the present invention. In the piezoelectric thin film resonator 34, an AlN thin film 23A is provided on a Si substrate 22, and a cavity 24 is made in the approximately central portion of the Si substrate 22 by anisotropic etching, and a ZnO piezoelectric thin film 25Z is disposed thereon, and an AlN piezoelectric thin film 25A is disposed thereon. Excitation electrodes 26a are respectively disposed on a boundary of the AlN piezoelectric thin film 25A and the ZnO piezoelectric thin film 25Z, and a lower surface of the thin film support portion 27, and are in continuity each other. Excitation electrodes 26b are respectively disposed on an upper surface of the AlN piezoelectric thin film 25A, and on a boundary of the ZnO piezoelectric thin film 25Z and the AlN thin film support portion 27, and are in continuity each other.

In the piezoelectric thin film resonator 34, because the AlN piezoelectric thin film 25A, the ZnO piezoelectric thin film 25Z, and the thin film support portion 27 are connected in parallel, when an electric signal is applied to the piezoelectric thin film 25A, 25Z, and the thin film support portion 27 via the excitation electrodes 26a and 26b, elastic vibrations are generated in the thin film support portion 27, and in each piezoelectric thin film 25A and 25Z, respectively, then, a very large resonant response and very strong resonant characteristics are achieved.

In such a laminate having a three-layered structure, by properly adjusting each ratio of film thickness of the AlN thin film support portion 27, the ZnO piezoelectric thin film 25Z, and the AlN piezoelectric thin film 25A, the temperature coefficient of resonant frequency becomes nearly zero and temperature characteristics become very stable.

In the piezoelectric thin film resonator 34 having such a structure, when the film thickness of the thin film support portion 27 and the film thickness of the AlN piezoelectric thin film 25A are equalized, the top and bottom structures of the laminate become nearly symmetric to each other, which prevents the occurrence of mechanical warps in the laminate.

In the piezoelectric thin film resonator 34 having such a structure, AlN and ZnO may be exchanged with each other, an AlN piezoelectric thin film may be disposed on a ZnO piezoelectric thin film, and a ZnO piezoelectric thin film may be disposed thereon.

Figure 11:
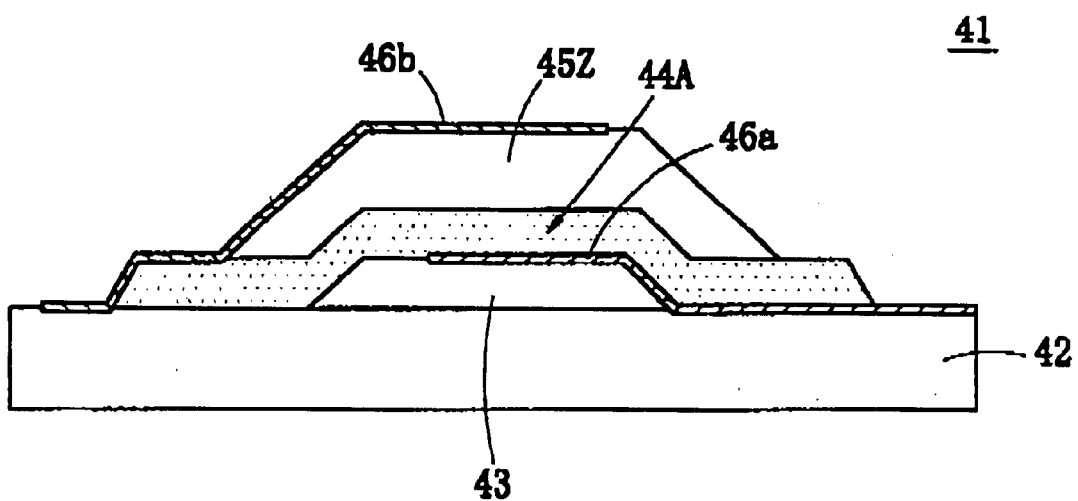
FIG. 11 is a sectional view of a piezoelectric thin film resonator according to a sixth preferred embodiment of the present invention.

FIG. 11 is a sectional view of a piezoelectric thin film resonator 41 according to a sixth preferred embodiment of the present invention. This is the piezoelectric thin film resonator 41 having an air bridge construction, made by forming a thin film support portion 44A, preferably made of AlN on a glass substrate 42 via an air gap 43, and forming a piezoelectric thin film 45Z, preferably made of ZnO, on the thin film support portion 44A. Then, excitation electrodes 46b and 46a are respectively disposed on an upper surface and a lower surface of a vibration portion, which includes a laminate of the ZnO piezoelectric thin film 45Z and the thin film support portion 44A.

Thus, excitation electrodes 46a and 46b are located on both sides of a vibration portion, including a laminate of the ZnO piezoelectric thin film 45Z and the thin film support portion 44A. As a result, the ZnO piezoelectric thin film 45Z and the thin film support portion 44A vibrate in the thickness mode when an electric signal for excitation is applied.

Figure 12A:
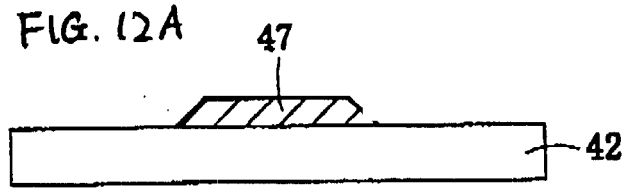
FIGS. 12A to 12F are figures illustrating a method of manufacturing the piezoelectric thin film resonator shown in FIG. 11.
Figure 12B:
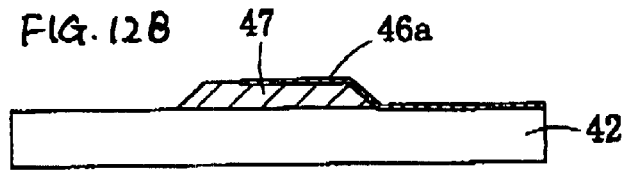

FIGS. 12A to 12F are figures illustrating a method of manufacturing the aforementioned piezoelectric thin film resonator 41. A sacrifice layer 47, preferably made of ZnO, is formed on a glass substrate 42, and the sacrifice layer 47 is etched leaving a portion, corresponding to an air gap 43, behind, as seen in FIG. 12A. Then, by using the vacuum evaporation method and the lift-off method, an excitation electrode 46a is formed, with Al, on the sacrifice layer 47, as seen in FIG. 12B.

Figure 12C:
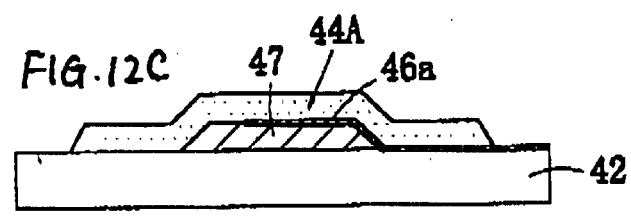
Figure 12D:
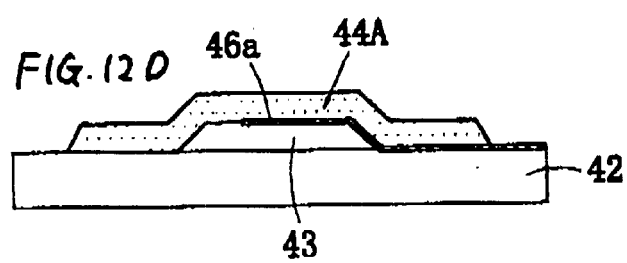
Figure 12E:
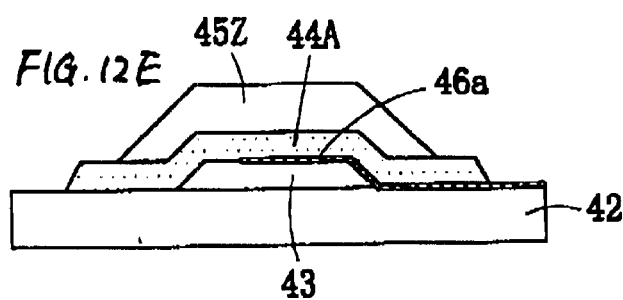
Figure 12F:
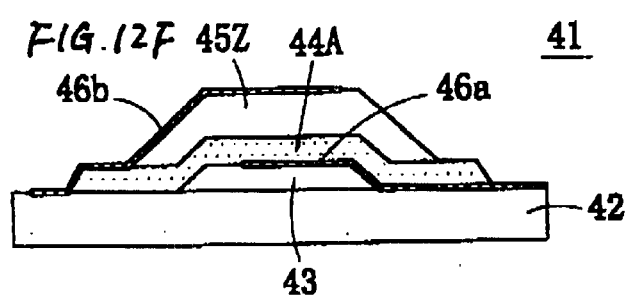

The thin film support portion 44A, preferably made of AlN, is formed on the sacrifice layer 47 preferably by a reactive sputtering method, as seen in FIG. 12C. Thereafter, the sacrifice layer 47 is etched with an aqueous solution of acetic acid, and the air gap 43 is formed on the lower surface of the thin film support portion 44A to float the thin film support portion 44A above an upper surface of glass substrate 42, as seen in FIG. 12D. Then, the ZnO piezoelectric thin film 45Z is formed on the upper surface of the thin film support portion 44A preferably by the sputtering method, as seen in FIG. 12E, and the excitation electrode 46b is formed on the ZnO piezoelectric thin film 45Z by the vacuum evaporation method using a metal mask, as seen in FIG. 12F. Thus, the piezoelectric thin film resonator 41 having a floating construction, shown in FIG. 11, is manufactured.

The temperature coefficient of resonant frequency of ZnO has a negative value, the temperature coefficient of resonant frequency of AlN has positive value. Therefore, in the piezoelectric thin film resonator 41, wherein the ZnO piezoelectric thin film 45Z is disposed on the thin film support portion 44A, having a floating construction, the temperature coefficient of resonant frequency becomes nearly zero by properly adjusting a film thickness ratio of the ZnO piezoelectric thin film 45Z and the thin film support portion 44A.

Furthermore, in conventional piezoelectric thin film resonators having a floating construction, thin film support portions only function to support the piezoelectric thin films. However, in the piezoelectric thin film resonator 41, because ZnO, constituting the ZnO piezoelectric thin film 45Z, and AlN constituting the thin film support portion 44A, are both piezoelectric materials, when an electric signal is applied to the ZnO piezoelectric thin film 45Z and the thin film support portion 44A via the excitation electrodes 46a and 46b, elastic vibrations are generated in both of the thin film support portion 44A and the ZnO piezoelectric thin film 45Z, then, a very large resonant response is obtained and very strong resonant characteristics are achieved.

According to the piezoelectric thin film resonator 41, having such a floating construction, since it is not necessary to remove the lower surface of the substrate 42 by etching, there is an advantage in that the resonator is not limited to substrates of specialized materials such as glass.

In the piezoelectric thin film resonator 41 of this preferred embodiment, also, ZnO and AlN may be exchanged with each other, and an AlN piezoelectric thin film may be formed on a ZnO thin film support portion.

Figure 13:
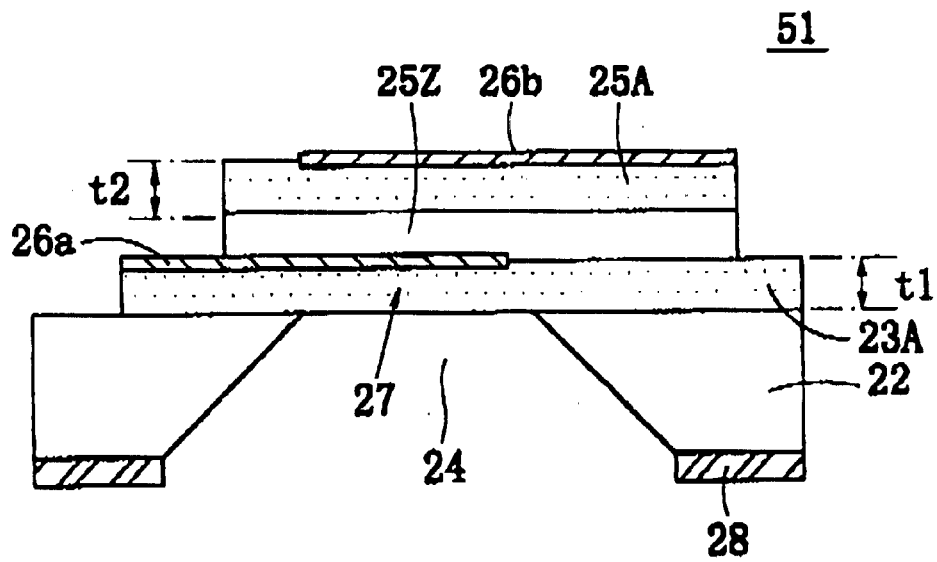
FIG. 13 is a sectional view of a piezoelectric thin film resonator according to a seventh preferred embodiment of the present invention.

FIG. 13 is a sectional view of a piezoelectric thin film resonator 51 according to a seventh preferred embodiment of the present invention. In the piezoelectric thin film resonator 51, an AlN thin film 23A is disposed on a Si substrate 22, and the AlN thin film 23A is formed by forming a cavity 24 in the approximately central portion of the Si substrate 22 preferably by anisotropic etching, and a ZnO piezoelectric thin film 25Z is formed thereon, furthermore, an AlN piezoelectric thin film 25A is formed thereon. An excitation electrode 26b is formed on an upper surface of the AlN piezoelectric thin film 25A, and an excitation electrode 26a is formed on a boundary of the thin film support portion 27 and the ZnO piezoelectric thin film 25Z.

The piezoelectric thin film resonator 51 is preferably manufactured in a manner similar to the third preferred embodiment, except for reversing an order of manufacturing of the thin film support portion 27 and the excitation electrode 26a.

In such a laminate having a three-layer structure, by properly adjusting each ratio of film thickness of the thin film support portion 27, the ZnO piezoelectric thin film 25Z, and the AlN piezoelectric thin film 25A, temperature coefficients of resonant frequency become nearly zero and temperature characteristics become stable.

In the piezoelectric thin film resonator 51, because the AlN piezoelectric thin film 25A and the ZnO piezoelectric thin film 25Z are held between the excitation electrodes 26a and 26b, when an electric signal is applied to the piezoelectric thin films 25A and 25Z, via the excitation electrodes 26a and 26b, elastic vibrations are generated in the piezoelectric thin films 25A and 25Z, then, a very large resonant response is obtained and very strong resonant characteristics are realized. On the other hand, the thin film support portion 27, including AlN, is not located between the excitation electrodes 26a and 26b. However, since AlN is a piezoelectric material, when a signal voltage is applied to the excitation electrodes 26a and 26b, the thin film support portion 27 is also applied with a voltage, by dielectric polarization, to contribute the improvement of resonant characteristics of the piezoelectric thin film resonator 51.

In the piezoelectric thin film resonator 51 having such a unique structure, when the film thickness of the thin film support portion 27 and the film thickness of the AlN piezoelectric thin film 25A are equalized, the top and bottom structures of the laminate become nearly symmetric each other and mechanical warpage in the laminate caused by temperature changes is prevented.

Figure 14:
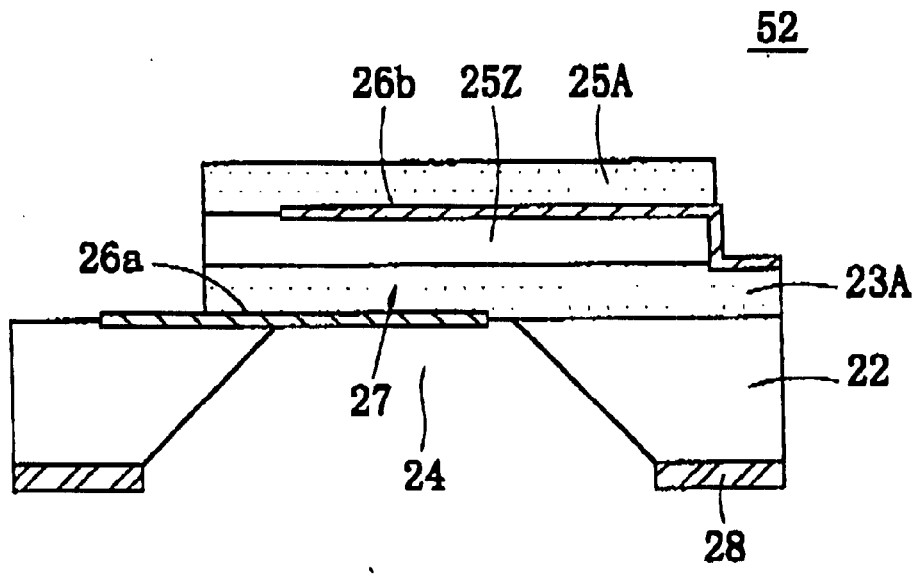
FIG. 14 is a sectional view of a piezoelectric thin film resonator according to an eighth preferred embodiment of the present invention.

FIG. 14 is a sectional view of a piezoelectric thin film resonator 52 according to a eighth preferred embodiment of the present invention. In this preferred embodiment, which preferably has a similar arrangement of the thin film support portion 27, and the piezoelectric thin film 25Z and 25A, as the piezoelectric thin film resonator 51, shown in FIG. 13, the excitation electrodes 26a and 26b are located on the upper surface of the ZnO piezoelectric thin films 25Z, and on the lower surface of the thin film support portion 27.

In the piezoelectric thin film resonator 52, because the thin film support portion 27 and the ZnO piezoelectric thin film 25Z is held between the excitation electrodes 26a and 26b, when an electric signal is applied to the thin film support portion 27 and the ZnO piezoelectric thin film 25Z via the excitation electrodes 26a and 26b, elastic vibrations are generated in the thin film support portion 27, and the ZnO piezoelectric thin film 25Z, then, a very large resonant response is obtained and very strong resonant characteristics are achieved. On the other hand, the AlN piezoelectric thin film 25A is not located between the excitation electrodes 26a and 26b. However, since AlN is a piezoelectric material, when a signal voltage is applied to the excitation electrodes 26a and 26b, the AlN piezoelectric thin film 25A is also applied with a voltage, by dielectric polarization, to contribute the improvement of resonant characteristics of the piezoelectric thin film resonator 52. Therefore, in this preferred embodiment, the piezoelectric thin film resonator 52 has stable temperature characteristics of resonant frequency, very strong resonant characteristics, and a construction that prevents warpage in the piezoelectric thin film 25Z and 25A, and the thin film support portion 27.

Figure 15:
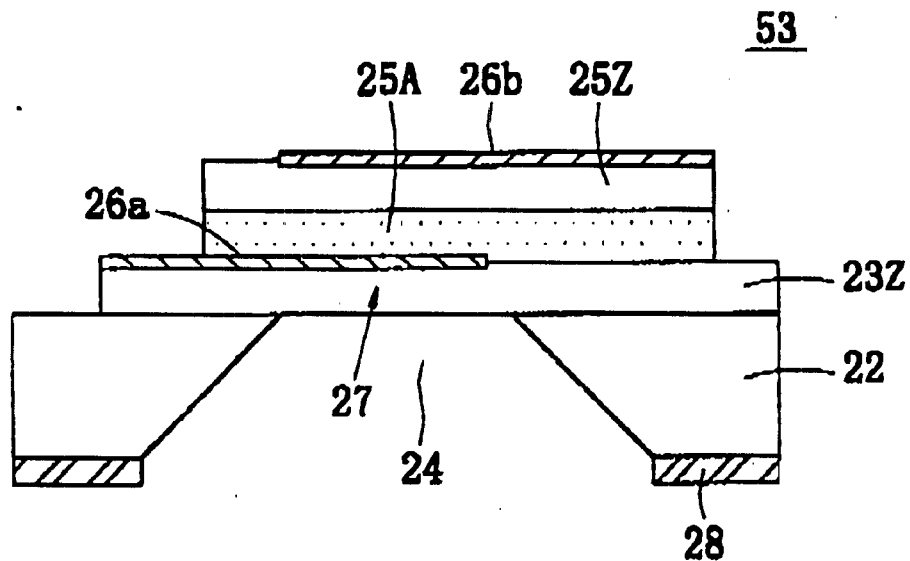
FIG. 15 is a sectional view of a piezoelectric thin film resonator according to a ninth preferred embodiment of the present invention.

FIG. 15 is a sectional view of a piezoelectric thin film resonator 53 according to a ninth preferred embodiment of the present invention. In the piezoelectric thin film resonator 53, a ZnO thin film 23Z is disposed on a Si substrate 22, and a cavity 24 is made in the approximately central part of the Si substrate 22 preferably by anisotropic etching. An AlN piezoelectric thin film 25A is disposed on the ZnO thin film 23Z, and furthermore, a ZnO piezoelectric thin film 25Z is provided thereon. The excitation electrode 26b is disposed on an upper surface of the ZnO piezoelectric thin film, and the excitation electrode 26a is disposed on a boundary of the thin film support portion 27 and the AlN piezoelectric thin film 25A.

In the piezoelectric thin film resonator 53, because the ZnO piezoelectric thin film 25Z and the AlN piezoelectric thin film 25A are held between the excitation electrodes 26a and 26b, when an electric signal is applied to the piezoelectric thin films 25Z and 25A, via the excitation electrodes 26a and 26b, elastic vibrations are generated in the piezoelectric thin films 25Z and 25A, then, a very large resonant response is obtained and very strong resonant characteristics are achieved. On the other hand, the thin film support portion 27, including ZnO, is not located between the excitation electrodes 26a and 26b. However, since ZnO is a piezoelectric material, when a signal voltage is applied to the excitation electrodes 26a and 26b, the ZnO thin film support portion 27 is also applied with a voltage, by dielectric polarization, to contribute the improvement of resonant characteristics of the piezoelectric thin film resonator 53.

Therefore, in this preferred embodiment, the piezoelectric thin film resonator 53 has stable temperature characteristics of resonant frequency, very strong resonant characteristics, and a construction that prevents warpage in the piezoelectric thin film 25Z and 25A, and the thin film support portion 27 from occurring due to temperature changes.

Figure 16:
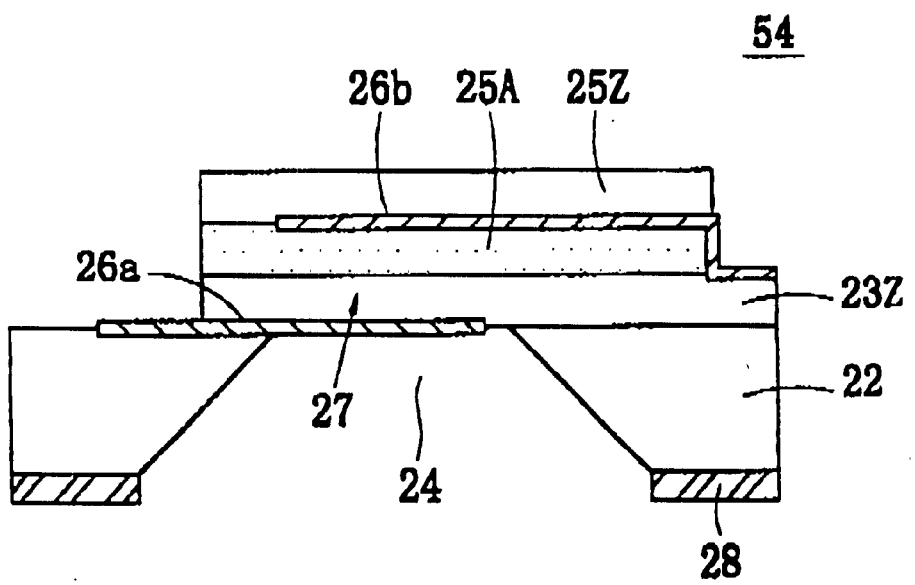
FIG. 16 is a sectional view of a piezoelectric thin film resonator according to a tenth preferred embodiment of the present invention.

FIG. 16 is a sectional view of a piezoelectric thin film resonator 54 according to a tenth preferred embodiment of the present invention. In this preferred embodiment, which has a similar arrangement of the thin film support portion 27, and the piezoelectric thin films 25A and 25Z, as the piezoelectric thin film resonator 53, shown in FIG. 15, the excitation electrodes 26a and 26b are disposed on the upper surface of the AlN piezoelectric thin films 25A, and on the lower surface of the thin film support portion 27.

In the piezoelectric thin film resonator 54, because the AlN piezoelectric thin film 25A and the thin film support portion 27 are held between the excitation electrodes 26b and 26a, when an electric signal is applied to the AlN piezoelectric thin film 25A and the thin film support portion 27, via the excitation electrodes 26a and 26b, elastic vibrations are generated in the AlN piezoelectric thin film 25A and the thin film support portion 27. As a result, a very large resonant response is obtained and very strong resonant characteristics are achieved. On the other hand, the ZnO piezoelectric thin film 25Z is not located between the excitation electrodes 26a and 26b. However, since ZnO is a piezoelectric material, when a signal voltage is applied to the excitation electrodes 26a and 26b, the ZnO piezoelectric thin film 25Z is also applied with a voltage, by dielectric polarization, to contribute to the improvement of resonant characteristics of the piezoelectric thin film resonator 54. Therefore, in this preferred embodiment, the piezoelectric thin film resonator 54 achieves very stable temperature characteristics of resonant frequency and very strong resonant characteristics.

Figure 17:
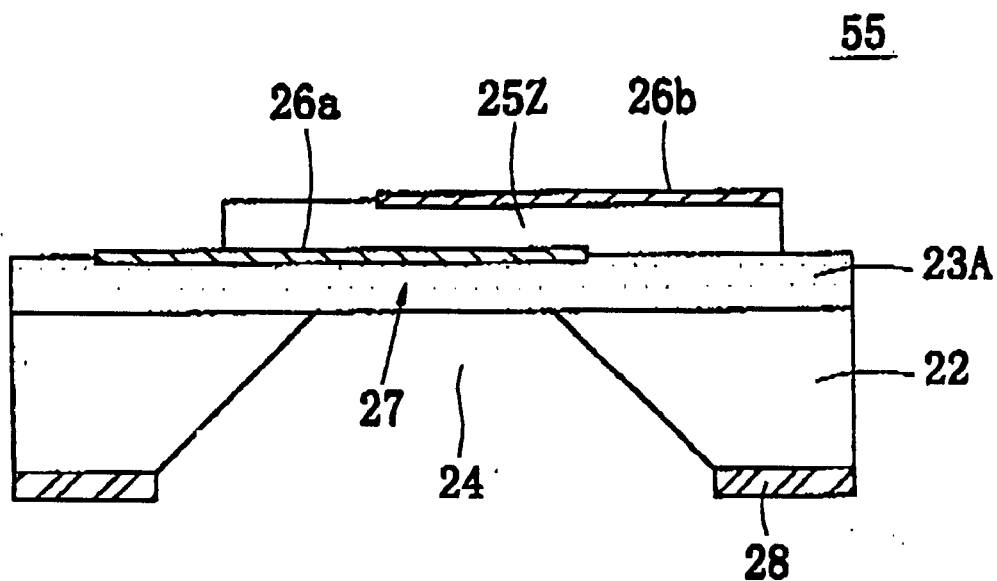
FIG. 17 is a sectional view of a piezoelectric thin film resonator according to an eleventh preferred embodiment of the present invention.
Figure 18:
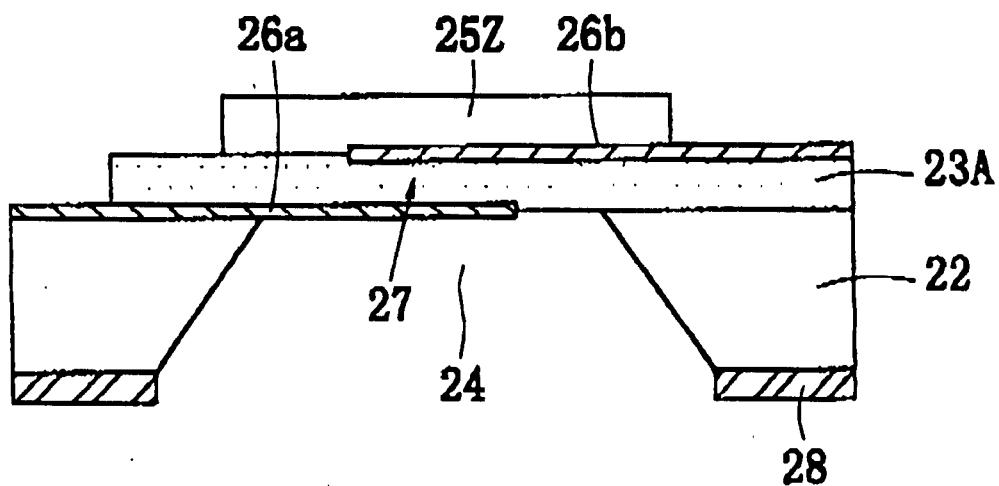
FIG. 18 is a sectional view of a piezoelectric thin film resonator according to a twelfth preferred embodiment of the present invention.

FIG. 17 is a sectional view of a piezoelectric thin film resonator 55 according to an eleventh preferred embodiment of the present invention. In the piezoelectric thin film resonator 55, an AlN thin film 23A is disposed on an upper surface of a Si substrate 22, and a cavity 24 is disposed in the approximately central part of the Si substrate 22. A ZnO piezoelectric thin film 25Z is disposed on an AlN piezoelectric thin film 23A. Excitation electrodes 26b and 26a are disposed on an upper surface and a lower surface of the ZnO piezoelectric thin film 25Z.

In the piezoelectric thin film resonator 55, because the ZnO piezoelectric thin film 25Z is held between the excitation electrodes 26a and 26b, when an electric signal is applied to the piezoelectric thin films 25Z, via the excitation electrodes 26a and 26b, an elastic vibration is generated in the piezoelectric thin film 25Z. As a result, a very large resonant response is achieved. On the other hand, the thin film support portion 27 is not located between the excitation electrodes 26a and 26b. However, since AlN is a piezoelectric material, when a signal voltage is applied to the excitation electrodes 26a and 26b, the thin film support portion 27 is also applied with a voltage, by dielectric polarization, to improve the resonant characteristics of the piezoelectric thin film resonator 55.

Therefore, in this preferred embodiment, the piezoelectric thin film resonator 55 achieves very stable temperature characteristics of resonant frequency and very strong resonant characteristics.

FIG. 16 is a sectional view of a piezoelectric thin film resonator 56 according to a twelfth preferred embodiment of the present invention. In this preferred embodiment, which preferably has a similar arrangement of the thin film support portion 27 and the ZnO piezoelectric thin film 25Z, as the piezoelectric thin film resonator 55, shown in FIG. 17, the excitation electrodes 26b and 26a are disposed on the upper surface and the lower surface of the thin film support portion 27.

In the piezoelectric thin film resonator 56, because the thin film support portion 27 is held between the excitation electrodes 26a and 26b, when an electric signal is applied to the thin film support portion 27, via the excitation electrodes 26a and 26b, an elastic vibration is generated in the thin film support portion 27. As a result, a very large resonant response is achieved. On the other hand, the ZnO piezoelectric thin film 25Z is not located between the excitation electrodes 26a and 26b. However, since ZnO is a piezoelectric material, when a signal voltage is applied to the excitation electrodes 26a and 26b, the ZnO piezoelectric thin film 25Z is also applied with a voltage, by dielectric polarization, to improve the resonant characteristics of the piezoelectric thin film resonator 56. Therefore, in this preferred embodiment, the piezoelectric thin film resonator 56 achieves very stable temperature characteristics of resonant frequency and very strong resonant characteristics.

Figure 19:
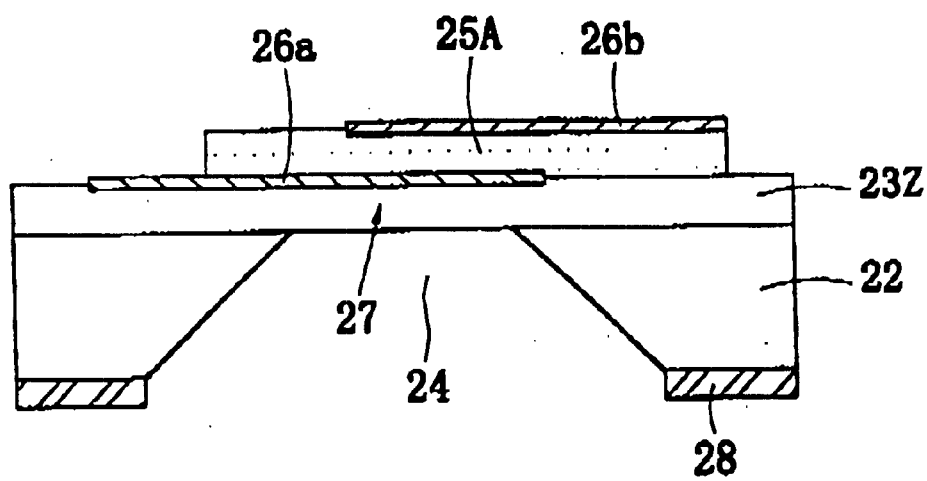
FIG. 19 is a sectional view of a piezoelectric thin film resonator according to a thirteenth preferred embodiment of the present invention.

FIG. 19 is a sectional view of a piezoelectric thin film resonator 57 according to a thirteenth preferred embodiment of the present invention. In the piezoelectric thin film resonator 57, a ZnO thin film 23Z is disposed on an upper surface of a Si substrate 22, and a cavity 24 is made in the approximately central portion of the Si substrate 22. A ZnO piezoelectric thin film 25Z is disposed on an AlN piezoelectric thin film 23A. Excitation electrodes 26b and 26a are disposed on an upper surface and a lower surface of the ZnO piezoelectric thin film 25Z.

In the piezoelectric thin film resonator 57, because the AlN piezoelectric thin film 25A is held between the excitation electrodes 26b and 26a, when an electric signal is applied to the piezoelectric thin film 25A, via the excitation electrodes 26a and 26b, an elastic vibration is generated in the AlN piezoelectric thin film 25A. As a result, a very large resonant response is achieved. On the other hand, the thin film support portion 27 is not located between the excitation electrodes 26a and 26b. However, since ZnO is a piezoelectric material, when a signal voltage is applied to the excitation electrodes 26a and 26b, the thin film support portion 27 is also applied with a voltage, by dielectric polarization, to improve the resonant characteristics of the piezoelectric thin film resonator 57. Therefore, in this preferred embodiment, also, the piezoelectric thin film resonator 57 achieves very stable temperature characteristics of resonant frequency and very strong resonant characteristics.

Figure 20:
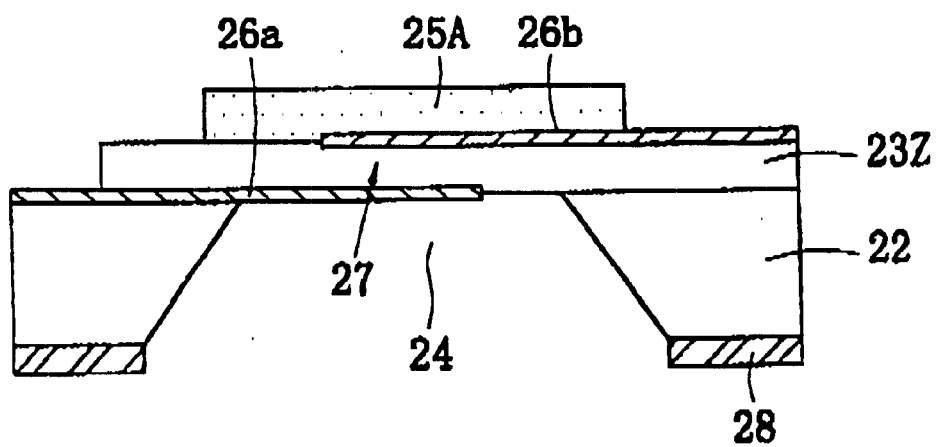
FIG. 20 is a sectional view of a piezoelectric thin film resonator according to a fourteenth preferred embodiment of the present invention.

FIG. 20 is a sectional view of a piezoelectric thin film resonator 58 according to a fourteenth preferred embodiment of the present invention. In this preferred embodiment, which preferably has a similar arrangement of the thin film support portion 27 and the AlN piezoelectric thin film 25A, as the piezoelectric thin film resonator 57, shown in FIG. 19, the excitation electrodes 26b and 26a are disposed on the upper surface and the lower surface of the thin film support portion 27.

In the piezoelectric thin film resonator 58, because the thin film support portion 27 is held between the excitation electrodes 26a and 26b, when an electric signal is applied to the thin film support portion 27, via the excitation electrodes 26a and 26b, an elastic vibration is generated in the thin film support portion 27. As a result, a very large resonant response is achieved. On the other hand, the AlN piezoelectric thin film 25A is not located between the excitation electrodes 26b and 26a. However, since AlN is a piezoelectric material, when a signal voltage is applied to the excitation electrodes 26a and 26b, the AlN piezoelectric thin film 25A is also supplied with a voltage, by dielectric polarization, to improve the resonant characteristics of the piezoelectric thin film resonator 58. Therefore, in this preferred embodiment, the piezoelectric thin film resonator 58 achieves very stable temperature characteristics of resonant frequency and very strong resonant characteristics.

Figure 21:
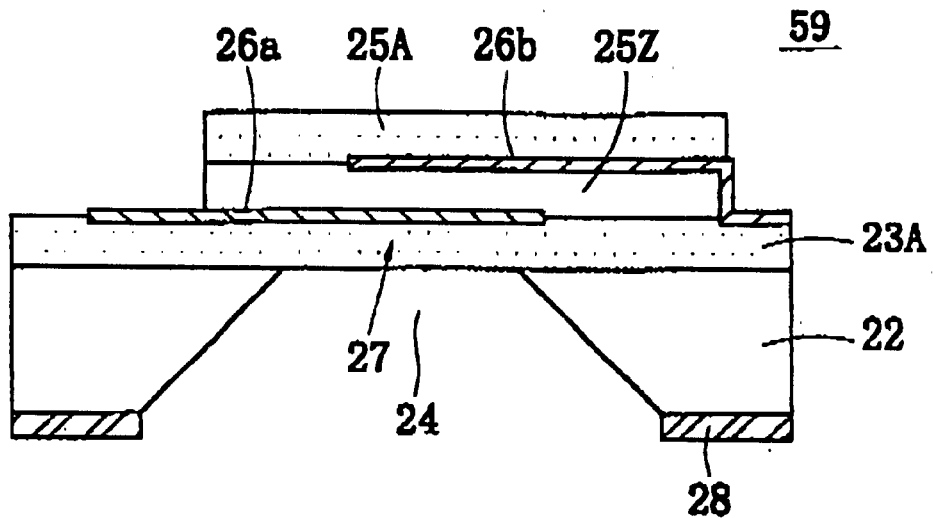
FIG. 21 is a sectional view of a piezoelectric thin film resonator according to a fifteenth preferred embodiment of the present invention.

FIG. 21 is a sectional view of a piezoelectric thin film resonator 59 according to a fifteenth preferred embodiment of the present invention. In the piezoelectric thin film resonator 59, an AlN thin film 23A is disposed on a Si substrate 22, and a cavity 24 is located in the approximately central portion of the Si substrate 22. A ZnO piezoelectric thin film 25Z is disposed on the AlN thin film 23A, and, furthermore, an AlN piezoelectric thin film 25A is disposed thereon. Then, only one layer of a three-layered structure, including the thin film support portion 27 and the piezoelectric thin films 25A and 25Z, is held between the excitation electrodes 26a and 26b.

In the piezoelectric thin film resonator 59, because only one layer selected from the thin film support portion 27 and the piezoelectric thin films 25A and 25Z, is held between the excitation electrodes 26a and 26b, when an electric signal is applied, via the excitation electrodes 26a and 26b, an elastic vibration is generated in the one layer. As a result, a very large resonant response is achieved. On the other hand, the remaining two layers are not located between the excitation electrodes 26b and 26a. However, since both layers are made of piezoelectric materials, when a signal voltage is applied to the excitation electrodes 26, both layers are also supplied with a voltage, by dielectric polarization, to improve the resonant characteristics of the piezoelectric thin film resonator 59. Therefore, in this preferred embodiment, the piezoelectric thin film resonator 59 achieves very stable temperature characteristics of resonant frequency and very strong resonant characteristics, and does not experience warpage caused by temperature changes.

Figure 22:
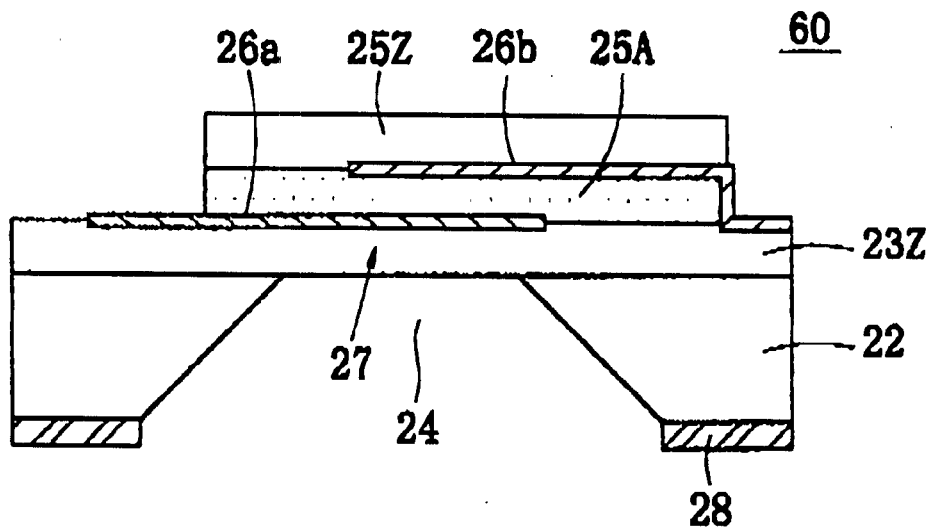
FIG. 22 is a sectional view of a piezoelectric thin film resonator according to a sixteenth preferred embodiment of the present invention.

FIG. 22 is a sectional view of a piezoelectric thin film resonator 60 according to a sixteenth preferred embodiment of the present invention. In the piezoelectric thin film resonator 60, a ZnO thin film 23Z is disposed on an upper surface of a Si substrate 22, and a cavity 24 is located in the approximately central portion of the Si substrate 22. An AlN piezoelectric thin film 25A is disposed on the ZnO thin film 23Z, and, furthermore, a ZnO piezoelectric thin film 25Z is disposed thereon. Then, only one layer of a three-layered structure including the thin film support portion 27 and the piezoelectric thin films 25A and 25Z, is held between the excitation electrodes 26b and 26a.

In the piezoelectric thin film resonator 60, because only one layer selected from the thin film support portion 27 and the piezoelectric thin films 25A and 25Z, is held between the excitation electrodes 26a and 26b, when an electric signal is applied, via the excitation electrodes 26a and 26b, an elastic vibration is generated in the one layer, then, a resonant response can be obtained. On the other hand, the remaining two layers are not located between the excitation electrodes 26a and 26b. However, since both layers are made of piezoelectric materials, when a signal voltage is applied to the excitation electrodes 26a and 26b, both layers are also supplied with a voltage, by dielectric polarization, to improve resonant characteristics of the piezoelectric thin film resonator 60. Therefore, in this preferred embodiment, the piezoelectric thin film resonator 60 achieves very stable temperature characteristics of resonant frequency and very strong resonant characteristics and does not experience warpage caused by temperature changes.

Various preferred embodiments, relating to diaphragm type piezoelectric thin film resonators, have been explained above. For piezoelectric thin film resonators having floating construction, various preferred embodiments, such as a resonator wherein more than two layers are located on a thin film support portion, a resonator wherein only a portion of a thin film support portion and a piezoelectric thin film are held between excitation electrodes, and a resonator wherein a combination of piezoelectric materials are changed, are possible.

Figure 23:
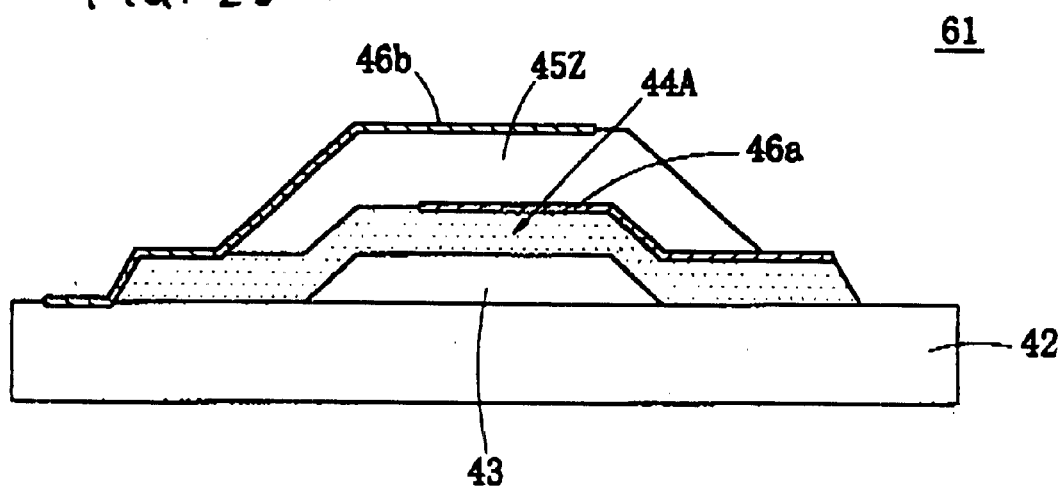
FIG. 23 is a sectional view of a piezoelectric thin film resonator according to a seventeenth preferred embodiment of the present invention.

For example, FIG. 23 is a sectional view of a piezoelectric thin film resonator 61 according to a seventeenth preferred embodiment of the present invention that illustrates a different preferred embodiment of the piezoelectric thin film resonator 61 having a floating construction. In the piezoelectric thin film resonator 61, an AlN thin film support portion 44A, having a floating construction, is located on a glass substrate 42 via an air gap 43, a ZnO piezoelectric thin film 45Z is disposed on the thin film support portion 44A, and excitation electrodes 46b and 46a are disposed on an upper surface and a lower surface of the ZnO piezoelectric thin film 45Z.

In the piezoelectric thin film resonator 61, because the piezoelectric thin film 45Z is held between the excitation electrodes 46b and 46a, when an electric signal is applied to the piezoelectric thin film 45Z, via the excitation electrodes 46a and 46b, an elastic vibration is generated in the piezoelectric thin film 45Z, then, a resonant response can be obtained. On the other hand, the thin film support portion 44A is not located between the excitation electrodes 46a and 46b. However, since AlN is a piezoelectric material, when a signal voltage is applied to the excitation electrodes 46a and 46b, the thin film support portion 44A is also supplied with a voltage, by dielectric polarization, to improve the resonant characteristics of the piezoelectric thin film resonator 61. Therefore, in this preferred embodiment, the piezoelectric thin film resonator 61 achieves very stable temperature characteristics of resonant frequency and very strong resonant characteristics.

Figure 24:
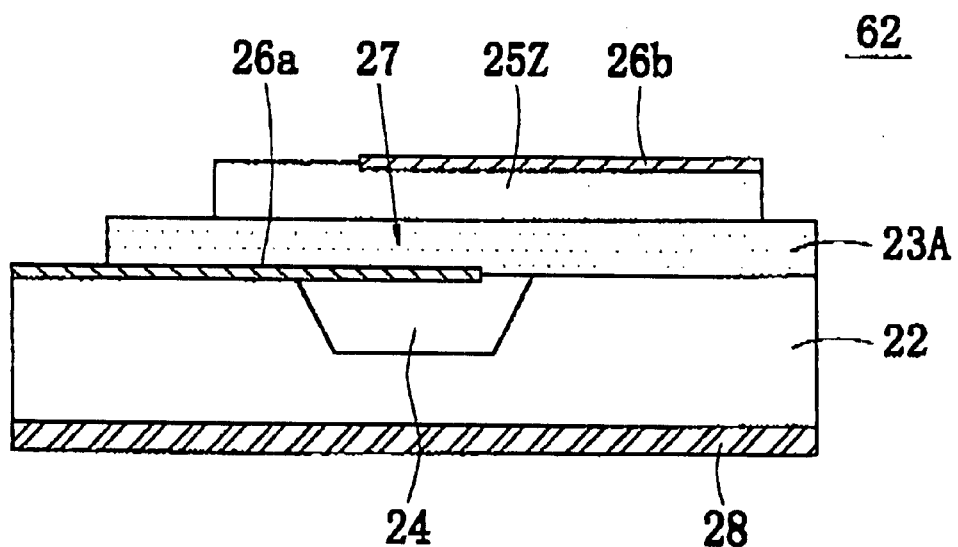
FIG. 24 is a sectional view of a piezoelectric thin film resonator according to an eighteenth preferred embodiment of the present invention.

FIG. 24 is a sectional view, illustrating a structure of a piezoelectric thin film resonator 62 according to an eighteenth preferred embodiment of the present invention. In this preferred embodiment, a cavity 24 is formed on an upper surface of a Si substrate 22 by etching the upper surface of the Si substrate 22, and an excitation electrode 26a, an AlN thin film 23A, a ZnO thin film 25, and an excitation electrode 26b are disposed on the Si substrate 22. A SiO$_2$ film 28 is disposed on a lower surface of the Si substrate 22. A manufacturing procedure for this preferred embodiment is as follows. The excitation electrode 26a and the AlN thin film 23A are formed on the upper surface of the Si substrate 22, and, thereafter, an etching liquid is injected into the upper surface of the Si substrate 22 through an opening provided in the AlN thin film 23A, to form the cavity 24 by etching a portion of the Si substrate 22 located under the opening of the AlN thin film 23A. Then the ZnO thin film 25 is formed on the upper surface of the AlN thin film 23A, and the excitation electrode 26b is formed thereon.

This preferred embodiment corresponds to the resonator according to the first preferred embodiment, wherein the cavity 24 is not formed from the lower surface of the substrate, but from the surface of the substrate. Such a piezoelectric resonator 30 achieves advantages similar to those achieved by the first preferred embodiment. Furthermore, in this preferred embodiment, according to combinations of piezoelectric films and electrodes corresponding to the second preferred embodiment to the sixteenth preferred embodiment, are possible.

FIG. 25 is a sectional view illustrating a structure of a piezoelectric thin film resonator 121 according to a nineteenth preferred embodiment of the present invention. In the piezoelectric thin film resonator 121, an SiO$_2$ thin film 123 is disposed on the upper surface of a Si substrate 122, and the approximately central portion of the Si substrate 122 is opened to define a cavity 124. That is, the Si substrate 122 has an opening defining the cavity 124 and has a frame shape. A portion of the SiO$_2$ thin film 123 corresponding to the cavity 124 is referred to as a thin film support portion 125. An SiO$_2$ film 129 is disposed on the lower surface of the Si substrate 122. On the upper surface of the SiO$_2$ thin film 123, a piezoelectric thin film 126A including AlN, is disposed, and a piezoelectric thin film 126Z, including ZnO, is disposed thereon, and a piezoelectric laminate 128 including the AlN piezoelectric thin film 126A and ZnO piezoelectric thin film 126Z, is disposed on the thin film support portion 125.

The piezoelectric thin film 126A and the piezoelectric thin film 126Z define a piezoelectric laminate, and the piezoelectric laminate and the SiO$_2$ thin film 123 define a laminated structure. Since the Si substrate 122 has a frame shape, a portion of the piezoelectric laminate over the cavity 124 is suspended by the Si substrate 122, so that this portion which may be referred to as a vibration portion, can vibrate.

One excitation electrode 127a is disposed on the lower surface of the AlN piezoelectric thin film 126A, and a portion of the excitation electrode 127a is exposed out of the AlN piezoelectric thin film 126A. Another excitation electrode 127b is disposed on the upper surface of the ZnO piezoelectric thin film 126Z.

Thus, excitation electrodes 127a and 127b are disposed on both sides of the piezoelectric laminate, and the vibration portion of the laminated structure vibrates in thickness mode as a whole when an electric signal for excitation is applied.

Figure 26A:
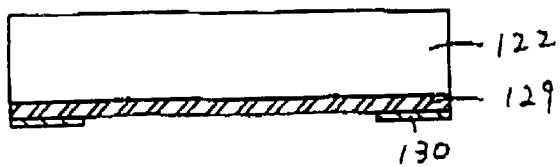
FIGS. 26A to 26H are figures illustrating a method of manufacturing the piezoelectric thin film resonator shown in FIG. 25.
Figure 26B:
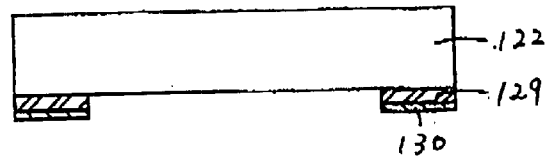
Figure 26C:
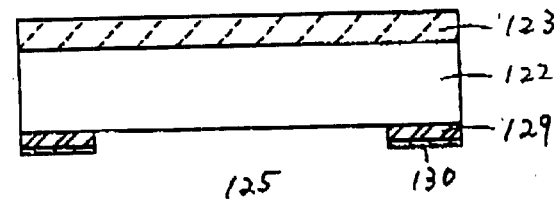

FIGS. 26A to 26H are figures illustrating a method of manufacturing the aforementioned piezoelectric thin film resonator 121. A (100) plane Si substrate 122 is prepared, the $SiO_2$ film 129 is formed on a lower surface of the Si substrate 122 by sputtering or other suitable process. Then, a resist film 130 is formed on the $SiO_2$ film 129, and, using photolithography, the resist film 130 is patterned to make an opening, as seen in FIG. 26A. Through the opening of the resist film 130, the $SiO_2$ film 129 is selectively etched with hydrofluoric acid, or other suitable material, to make an opening, being adjusted to the opening of the resist film, into the $SiO_2$ film 129, as seen in FIG. 26B. After removing the resist film 130, having been formed on the lower surface of the Si substrate 122, the $SiO_2$ thin film 123 is formed on the surface of the Si substrate 122, by sputtering, CVD, or other suitable process, as seen in FIG. 26C.

Figure 26D:
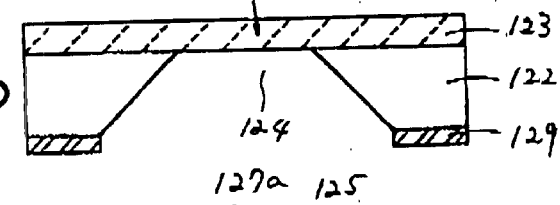

Using the $SiO_2$ film 129, on the lower surface, as a mask, the Si substrate 122 is anisotropically etched with an etching liquid, such as TMAH, from the lower surface. By the anisotropic etching, the approximately center portion of the Si substrate 122 is opened, and the cavity 124 is formed under the $SiO_2$ thin film 123. Accordingly, the surrounding areas of the $SiO_2$ thin film 123 are supported by the Si substrate 122, and the approximately center portion of the $SiO_2$ thin film 123 is free from the Si substrate 122 on the cavity 124, as seen in FIG. 26D. At this time, because the $SiO_2$ thin film 123 is not etched with etching liquids such as TMAH, a process to float the $SiO_2$ thin film 123 above the Si substrate 122, can be easily conducted.

Figure 26E:
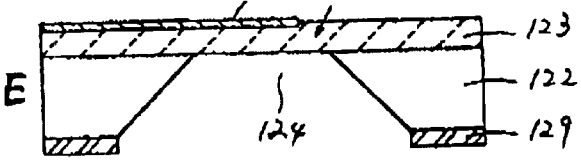
Figure 26F:
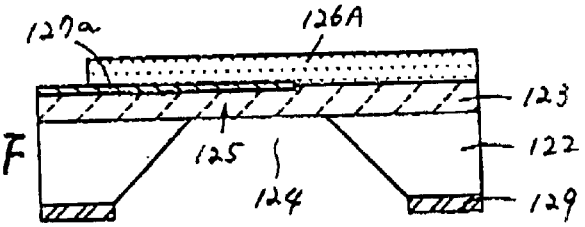

Then, an electrode material is deposited on the surface of the $SiO_2$ thin film 122, preferably by a lift-off vapor deposition method, to form one excitation electrode 127a, as seen in FIG. 26E. Thereafter, the AlN piezoelectric thin film 126A is formed on the excitation electrode 127a and the $SiO_2$ thin film 123 preferably by reactive sputtering, as seen in FIG. 26F. At this time, a portion of the excitation electrode 127a is exposed out of the AlN thin film.

Figure 26G:
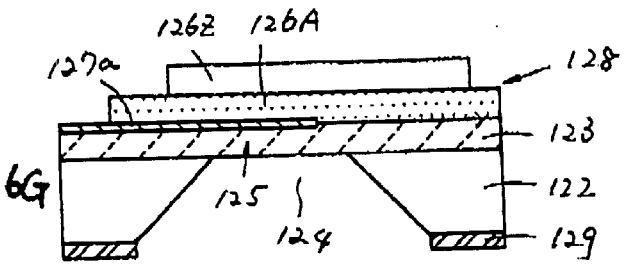
Figure 26H:
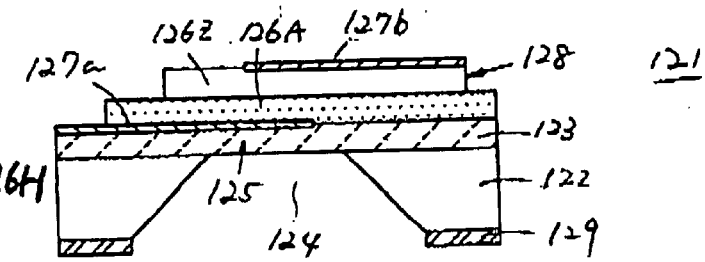

Furthermore, ZnO is deposited preferably by reactive sputtering using a metal mask, to form a ZnO piezoelectric thin film 126Z on the AlN piezoelectric thin film 126A, as seen in FIG. 26G. The electrode material is deposited on the ZnO piezoelectric thin film 126Z, preferably by a lift-off vapor deposition method, to form the other excitation electrode 127b, as seen in FIG. 26H. Thus, the piezoelectric thin film resonator 121, having a structure shown in FIG. 25, is manufactured.

Thus, the temperature coefficient of resonant frequency of ZnO has a negative value, the temperature coefficient of resonant frequency of AlN and $SiO_2$ have positive values. Therefore, in the piezoelectric thin film resonator 121, which is formed by uniting the $SiO_2$ thin film support portion 125, the AlN piezoelectric thin film 126A, and the ZnO piezo-electric thin film 126Z, the temperature coefficient of resonant frequency becomes nearly zero by properly adjusting a film thickness ratio of the $SiO_2$ thin film 123, the AlN piezoelectric thin film 126A, and the ZnO piezoelectric thin film 126Z.

In conventional piezoelectric thin film resonators, only one thin film composed of the two kinds of thin films, having temperature coefficients of resonant frequency of different signs in order to offset the temperature coefficients, each other, has been formed from piezoelectric materials. On the other hand, in the piezoelectric thin film resonator 121 of various preferred embodiments of the present invention, the ZnO piezoelectric thin film 126Z, having a negative temperature coefficients of resonant frequency, and the AlN piezoelectric thin film 126A, having a positive temperature coefficient of resonant frequency, are both piezoelectric materials, and, therefore, when an electric signal is applied to both piezoelectric thin films 126A and 126Z, via the excitation electrodes 127a and 127b, elastic vibrations (thickness mode vibrations) are generated in both piezoelectric thin films 126A and 126Z. As a result, a very large resonant response is obtained and very strong resonant characteristics are achieved.

Furthermore, because the temperature coefficient of resonant frequency of $SiO_2$ is greater than the temperature coefficient of resonant frequency of AlN, in order to offset the temperature coefficient of resonant frequency of ZnO, by using the $SiO_2$ thin film support portion 125 together, the total film thickness of the piezoelectric laminate 128 and the $SiO_2$ thin film support portion 125 can be very thin, and the piezoelectric thin film resonator 121 can be used with high frequencies, rather than a case in which the AlN piezoelectric thin film 126A is used alone.

Furthermore, there are three kinds of material parameters including the $SiO_2$ thin film support portion 125 which is an insulator, the AlN piezoelectric thin film 126A, and the ZnO piezoelectric thin film 126Z. Thus, it is possible to adjust characteristics, other than the temperature coefficients of resonant frequency and the resonant characteristics, for example, the electromechanical coefficient, and others, to further increase the design flexibility.

Figure 27:
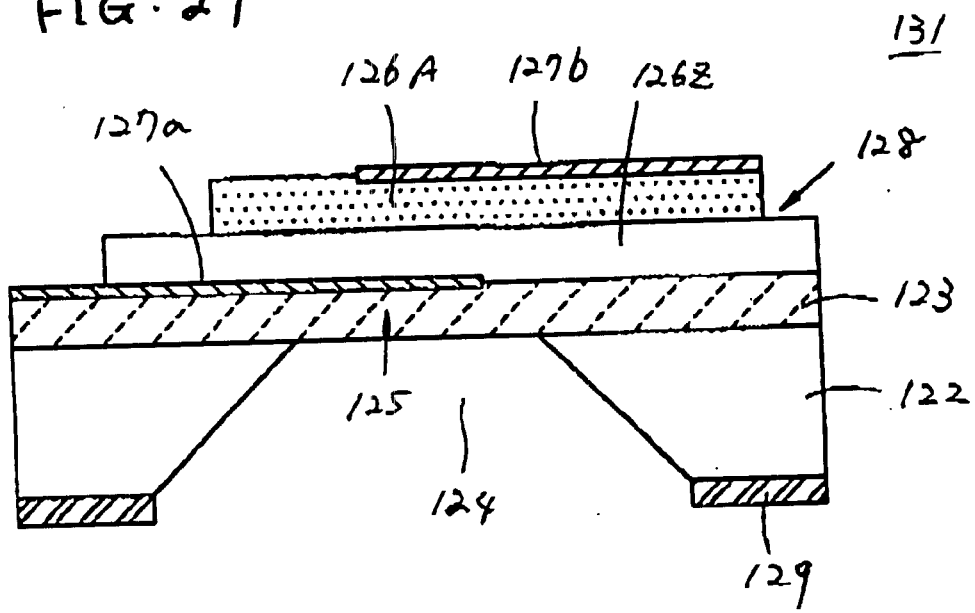
FIG. 27 is a sectional view of a piezoelectric thin film resonator according to a twentieth preferred embodiment of the present invention.

FIG. 27 is a sectional view of a piezoelectric thin film resonator 131 according to a twentieth preferred embodiment of the present invention. In the piezoelectric thin film resonator 131, a $SiO_2$ thin film 123 is disposed on the upper surface of the Si substrate 122, and the $SiO_2$ thin film 123 is provided preferably by forming a cavity 124 in the approximately central portion of the Si substrate 122. Furthermore, a ZnO piezoelectric thin film 126Z is disposed on a $SiO_2$ thin film support portion 125, and an AlN piezoelectric thin film 126A is disposed thereon to define a piezoelectric laminate 128 which includes the ZnO piezoelectric thin film 126Z and the AlN piezoelectric thin film 126A, on the $SiO_2$ thin film support portion 125. Excitation electrodes 127b and 127a are disposed, respectively, on an upper surface and a lower surface of the piezoelectric laminate 128 which includes the AlN piezoelectric thin film 126A and the ZnO piezoelectric thin film 126Z.

Because the piezoelectric thin film resonator 131 substantially corresponds to the nineteenth preferred embodiment, wherein positions of the AlN piezoelectric thin film 126A and the ZnO piezoelectric thin film 126Z are exchanged with each other, similarly to the nineteenth preferred embodiment, the temperature coefficient of resonant frequency becomes very stable by properly adjusting each film thickness of the SiO2 thin film support portion 125, the ZnO piezoelectric thin film 126Z, and the AlN piezoelectric thin film 126A. Furthermore, the ZnO piezoelectric thin film 126Z and the AlN piezoelectric thin film 126A having opposite polarity temperature coefficients of resonant frequency are both piezoelectrically vibrated, so that it is possible to make the resonant impedance of the piezoelectric thin film resonator 131 large, and to achieve very strong resonant characteristics.

It is also similar to the nineteenth preferred embodiment that the etching operation can be performed easily due to the SiO$_2$ thin film support portion 125, the piezoelectric thin film resonator 131 can be used with high frequencies due to making the total film thickness of the piezoelectric laminate 128 and the SiO$_2$ thin film support portion 125 very small, and the design flexibility is very high because of the increase of material parameters.

Figure 28:
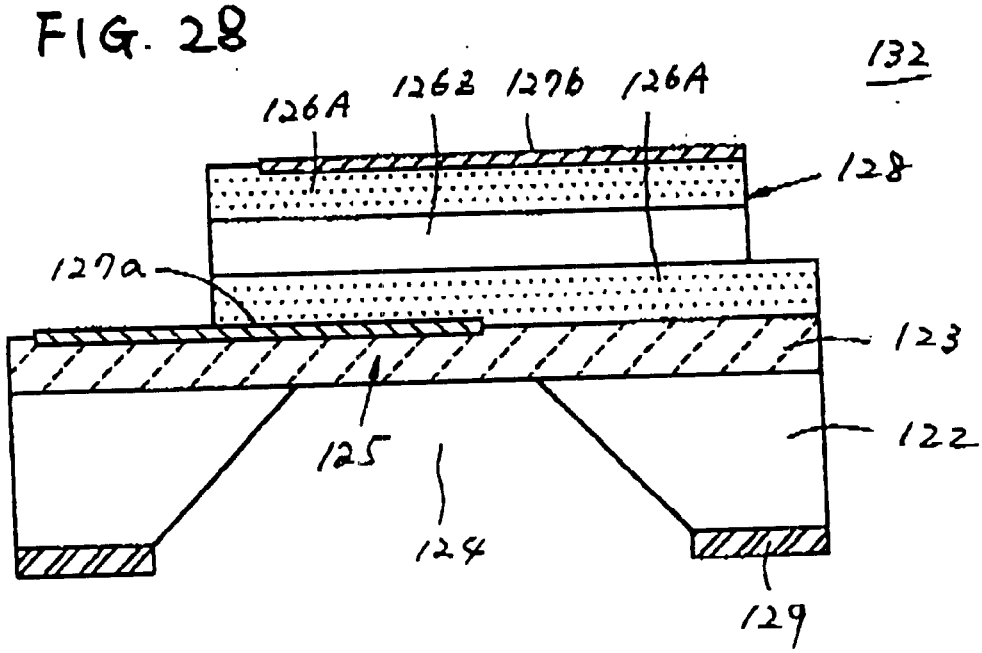
FIG. 28 is a sectional view of a piezoelectric thin film resonator according to a twenty-first preferred embodiment of the present invention.

FIG. 28 is a sectional view of a piezoelectric thin film resonator 132 according to a twenty-first preferred embodiment of the present invention. In the piezoelectric thin film resonator 132, a SiO$_2$ thin film support portion 125 is disposed on the Si substrate 122. A cavity 124 is formed in the approximately central portion of the Si substrate 122 by the anisotropic etching, to form the SiO$_2$ thin film support portion 125. An AlN piezoelectric thin film 126A is disposed on the SiO$_2$ thin film support portion 125, a ZnO piezoelectric thin film 126Z is disposed thereon, and a AlN piezoelectric thin film 126A is disposed, further, thereon to define a piezoelectric laminate 128, having a three-layer structure, on the SiO$_2$ thin film support portion 125. Then, excitation electrodes 127b and 127a are disposed, respectively, on an upper surface and a lower surface of a vibration portion including the piezoelectric laminate 128 which is defined by the AlN piezoelectric thin film 126A, in an upper layer, the ZnO piezoelectric thin film 126Z, and the AlN piezoelectric thin film 126A, in a lower layer.

In the case in which the piezoelectric thin film resonator 128, having such a three-layer structure, by properly adjusting each film thickness ratio of the ZnO piezoelectric thin film 126Z, having a negative temperature coefficient of resonant frequency, and the AlN piezoelectric thin film 126A, having a positive temperature coefficient of resonant frequency, and the SiO$_2$ thin film support portion 125, the temperature coefficient of resonant frequency becomes nearly zero, and temperature characteristics become very stable.

Furthermore, the AlN piezoelectric thin film 126A and the ZnO piezoelectric thin film 126Z, in the upper layer and the lower layer held between the excitation electrodes 127a and 127b, are both piezoelectric materials. Therefore, when an electric signal is applied to the piezoelectric laminate 128, via the excitation electrodes 127a and 127b, elastic vibrations are generated in each piezoelectric thin film 126A, 126Z and 126A of the piezoelectric laminate 128. As a result, a very large resonant response is obtained and very strong resonant characteristics are achieved.

In the piezoelectric thin film resonator 132, there are advantages that the etching operation can be performed easily due to the SiO$_2$ thin film support portion 125, the piezoelectric thin film resonator 132 can be used with high frequencies due to making the total film thickness very small, and the design flexibility is very high because of the increase of material parameters.

Figure 29:
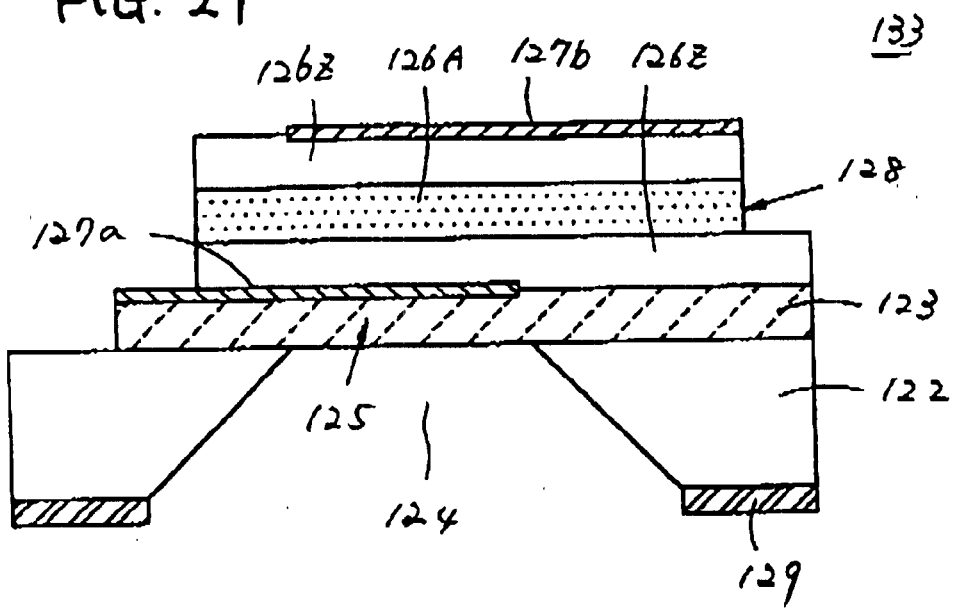
FIG. 29 is a sectional view of a piezoelectric thin film resonator according to a twenty-second preferred embodiment of the present invention.

FIG. 29 is a sectional view of a piezoelectric thin film resonator 133 according to a twenty-second preferred embodiment of the present invention. In the piezoelectric thin film resonator 133, a ZnO$_2$ thin film 123 is disposed on the upper surface of the Si substrate 122, and a cavity 124 is formed in the approximately central portion of the Si substrate 122 to define the SiO$_2$ thin film support portion 125. A ZnO piezoelectric thin film 126Z is disposed on the SiO$_2$ thin film support portion 125, an AlN piezoelectric thin film 126A is disposed thereon, and furthermore, a ZnO piezoelectric thin film 126Z is disposed thereon to define a piezoelectric laminate 128 having a three-layer structure, on the SiO$_2$ thin film support portion 125. Then, excitation electrodes 127b and 127a are provided, respectively, on an upper surface and a lower surface of the piezoelectric laminate 128, having a three-layer structure.

Because the piezoelectric thin film resonator 133 substantially corresponds to the twenty-first preferred embodiment, wherein, regarding the piezoelectric thin films 126Z, 126A, and 126Z, constituting the piezoelectric laminate 128, positions of the AlN piezoelectric thin film 126A and the ZnO piezoelectric thin film 126Z are exchanged with each other, similarly to the twenty-first preferred embodiment, the temperature coefficient of resonant frequency becomes stable by properly adjusting each film thickness of the SiO$_2$ thin film support portion 125, and each piezoelectric thin film 126Z, 126A, and 126Z. Furthermore, each piezoelectric thin film 126Z, 126A, and 126Z, constituting the piezoelectric laminate 128, is piezoelectrically vibrated, so that it is possible to make the resonant impedance of the piezoelectric thin film resonator 133 large, and to obtain very strong resonant characteristics.

It is also similar to other preferred embodiments that the etching operation can be performed easily due to the SiO$_2$ thin film support portion 125, the piezoelectric thin film resonator 133 can be used with high frequencies due to making the total film thickness of the piezoelectric laminate 128 and the SiO$_2$ thin film support portion 125 thin, and the design flexibility is very high due to an increase of material parameters.

Figure 30:
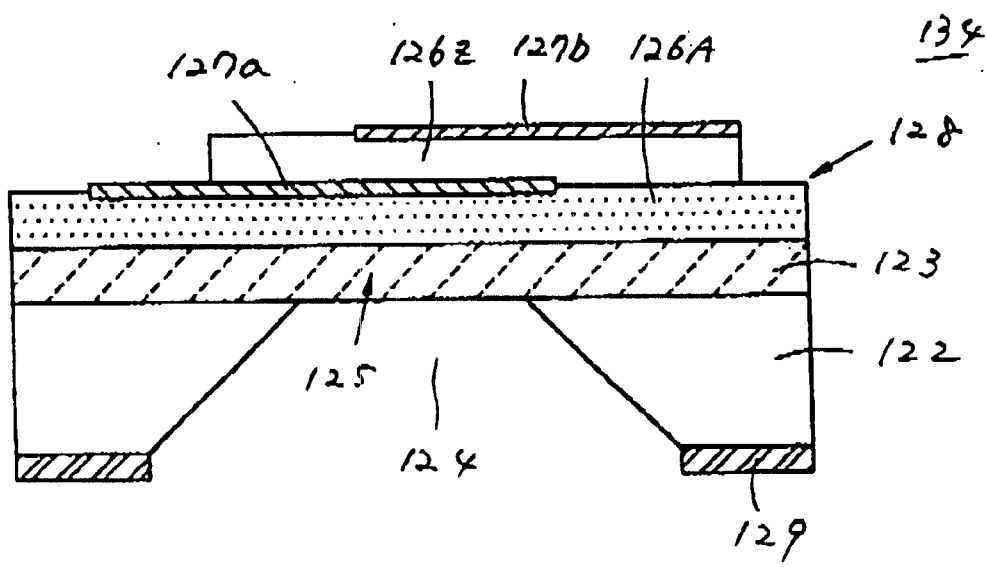
FIG. 30 is a sectional view of a piezoelectric thin film resonator according to a twenty-third preferred embodiment of the present invention.

FIG. 30 is a sectional view of a piezoelectric thin film resonator 134 according to a twenty-third preferred embodiment of the present invention. In the piezoelectric thin film resonator 134, a SiO$_2$ thin film 123 is disposed on a Si substrate 122. A cavity 124 is formed in the approximately central portion of the Si substrate 122 preferably by anisotropic etching, to form the SiO$_2$ thin film 123. An AlN piezoelectric thin film 126A is disposed on the SiO$_2$ thin film support portion 125, a ZnO piezoelectric thin film 126Z is disposed thereon, to define a piezoelectric laminate 128 including the AlN piezoelectric thin film 126A and the ZnO piezoelectric thin film 126Z, on the SiO$_2$ thin film support portion 125. Then, excitation electrodes 127b and 127a are disposed on an upper surface and a lower surface of the ZnO piezoelectric thin film 126Z.

In the piezoelectric thin film resonator 134 having such a unique structure, by properly adjusting each film thickness ratio of the thin film support portion 125 made of SiO$_2$, the AlN piezoelectric thin film 126A, and the ZnO piezoelectric thin film 126Z, the temperature coefficient of resonant frequency becomes nearly zero and temperature characteristics become very stable.

In the piezoelectric thin film resonator 134, because the ZnO piezoelectric thin film 126Z is held between the excitation electrodes 127a and 127b, when an electric signal is applied to the ZnO piezoelectric thin film 126Z, via the excitation electrodes 127a and 127b, an elastic vibration (thickness mode vibration) is generated in the ZnO piezoelectric thin film 126Z. As a result, a very large resonant response can be obtained and very strong resonant characteristics are achieved. On the other hand, the AlN piezoelectric thin film 126A is located not between the excitation electrodes 127a and 127b. However, since AlN is a piezoelectric material, when a signal voltage is applied to the excitation electrodes 127a and 127b, the AlN piezoelectric thin film 126A is also supplied with a voltage, by dielectric polarization, to contribute to the improvement of resonant characteristics of the piezoelectric thin film resonator 134.

It is also similar to other preferred embodiments that the etching operation can be performed easily due to the $SiO_2$ thin film support portion 125, the piezoelectric thin film resonator 134 can be used with high frequencies due to the very small total film thickness of the piezoelectric laminate 128 and the $SiO_2$ thin film support portion 125, and the design flexibility is very high due to an increase of material parameters.

Figure 31:
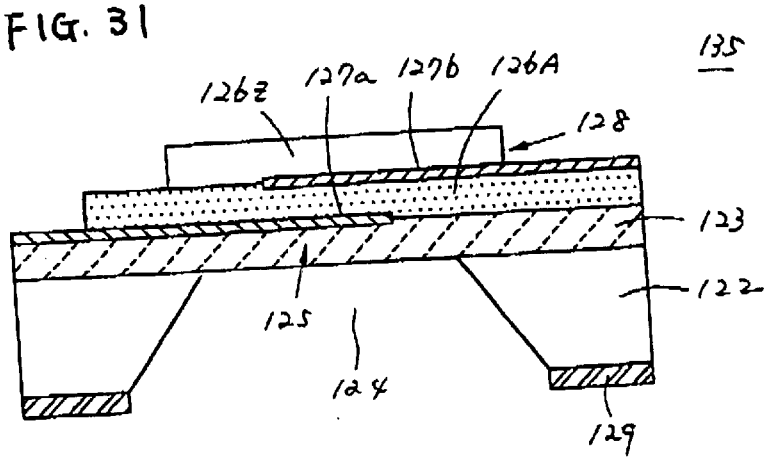
FIG. 31 is a sectional view of a piezoelectric thin film resonator according to a twenty-fourth preferred embodiment of the present invention.

FIG. 31 is a sectional view of a piezoelectric thin film resonator 135 according to a twenty-fourth preferred embodiment of the present invention. In the piezoelectric thin film resonator 135, having a similar arrangement of the $SiO_2$ thin film support portion 125, and the piezoelectric laminate 128 as in the twenty-third preferred embodiment (FIG. 30), excitation electrodes 127b and 127a are disposed, respectively, on an upper surface and a lower surface of the AlN piezoelectric thin film 126A.

In the piezoelectric thin film resonator 135, having such a structure, the temperature coefficient of resonant frequency becomes nearly zero, and temperature characteristics become very stable. The ZnO piezoelectric thin film 126Z is not located between the excitation electrodes 127a and 127b. However, since ZnO is a piezoelectric material, when a signal voltage is applied to the excitation electrodes 127a and 127b, the ZnO piezoelectric thin film 126Z is also supplied with a voltage, by dielectric polarization, to contribute to the improvement of resonant characteristics of the piezoelectric thin film resonator 135.

Furthermore, the piezoelectric thin film resonator 135, wherein the $SiO_2$ thin film 123 is disposed, similarly to the piezoelectric thin film resonator 134 according to a twenty-third preferred embodiment, has advantages that the etching operation of the Si substrate 122 can be performed easily, the design flexibility is very high, and it is possible to be used with high frequencies.

Figure 32:
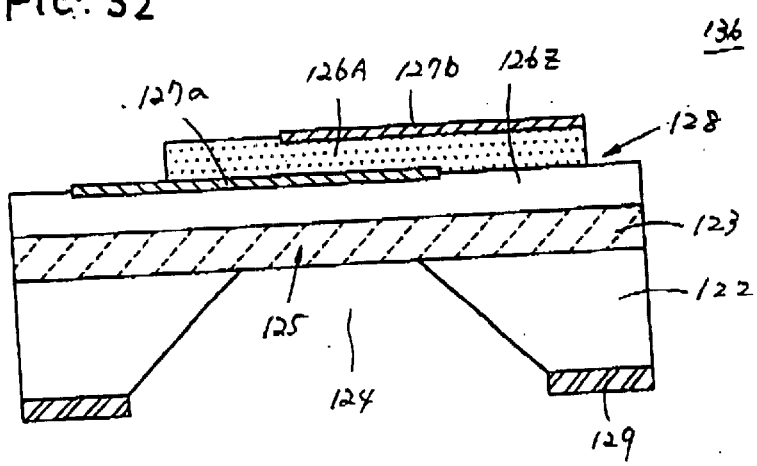
FIG. 32 is a sectional view of a piezoelectric thin film resonator according to a twenty-fifth preferred embodiment of the present invention.

FIG. 32 is a sectional view of a piezoelectric thin film resonator 136 according to a twenty-fifth preferred embodiment of the present invention. In the piezoelectric thin film resonator 136, a $SiO_2$ thin film 123 is disposed on a Si substrate 122. A cavity 124 is formed in the approximately central portion of the Si substrate 122 preferably by anisotropic etching, to form the $SiO_2$ thin film 123. A ZnO piezoelectric thin film 126Z is disposed on the $SiO_2$ thin film support portion 125, an AlN piezoelectric thin film 126A is disposed thereon, to define a piezoelectric laminate 128 including the ZnO piezoelectric thin film 126Z and the AlN piezoelectric thin film 126A, on the thin film support portion 125. Then, excitation electrodes 127b and 127a are disposed on an upper surface and a lower surface of the AlN piezoelectric thin film 126A.

In the piezoelectric thin film resonator 136 having such a unique structure, by properly adjusting each film thickness ratio of the thin film support portion 125 made of $SiO_2$, the ZnO piezoelectric thin film 126Z, and the AlN piezoelectric thin film 126A, the temperature coefficient of resonant frequency becomes nearly zero, and temperature characteristics become very stable.

In the piezoelectric thin film resonator 136, because the AlN piezoelectric thin film 126A is held between the excitation electrodes 127a and 127b, when an electric signal is applied to the AlN piezoelectric thin film 126A, via the excitation electrodes 127a and 127b, an elastic vibration is generated in the AlN piezoelectric thin film 126A. As a result, a very large resonant response is obtained and very strong resonant characteristics are realized. On the other hand, the ZnO piezoelectric thin film 126Z is located not between the excitation electrodes 127a and 127b. However, since ZnO is a piezoelectric material, when a signal voltage is applied to the excitation electrodes 127a and 127b, the ZnO piezoelectric thin film 126Z is also applied with a voltage, by dielectric polarization, to contribute to the improvement of resonant characteristics of the piezoelectric thin film resonator 136.

It is also similar to other preferred embodiments that the etching operation can be performed easily due to the $SiO_2$ thin film support portion 125, the piezoelectric thin film resonator 136 can be used with high frequencies due to very small total film thickness of the piezoelectric laminate 128 and the $SiO_2$ thin film support portion 125, and the design flexibility is very high due to an increase of material parameters.

Figure 33:
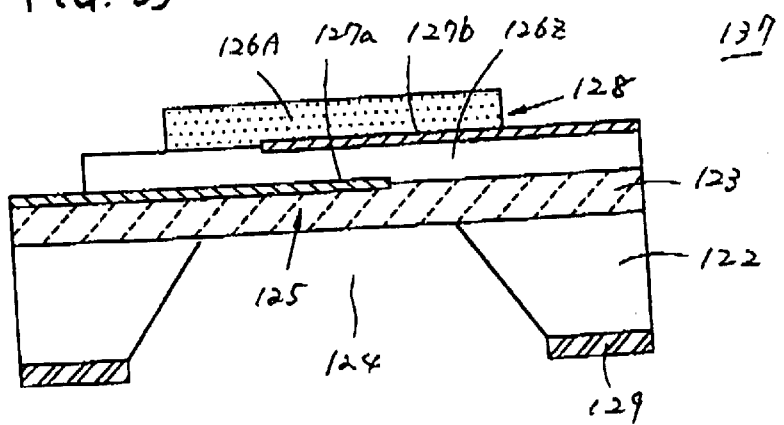
FIG. 33 is a sectional view of a piezoelectric thin film resonator according to a twenty-sixth preferred embodiment of the present invention.

FIG. 33 is a sectional view of a piezoelectric thin film resonator 137 according to a preferred twenty-sixth embodiment of the present invention. In the piezoelectric thin film resonator 137, having a similar arrangement of the $SiO_2$ thin film support portion 125, and the piezoelectric laminate 128 as in the twenty-fifth preferred embodiment (FIG. 32), excitation electrodes 127b and 127a are disposed, respectively, on an upper surface and a lower surface of the ZnO piezoelectric thin film 126Z.

In the piezoelectric thin film resonator 137, having such a structure, the temperature coefficient of resonant frequency becomes nearly zero, and temperature characteristics become stable. The AlN piezoelectric thin film 126A is not located between the excitation electrodes 127a and 127b. However, since AlN is a piezoelectric material, when a signal voltage is applied to the excitation electrodes 127a and 127b, the AlN piezoelectric thin film 126A is also applied with a voltage, by dielectric polarization, to contribute to the improvement of resonant characteristics of the piezoelectric thin film resonator 137.

Furthermore, the piezoelectric thin film resonator 137, wherein the thin film is formed from the $SiO_2$ thin film 123, similarly to the piezoelectric thin film resonator 136 according to a twenty-fifth preferred embodiment, has advantages that the etching operation of the Si substrate 122 can be performed easily, the design flexibility is very high, and it is possible to be used with high frequencies.

FIG. 34 is a sectional view of a piezoelectric thin film resonator 138 according to a twenty-seventh preferred embodiment of the present invention. In the piezoelectric thin film resonator 138, a $SiO_2$ thin film 123 is disposed on a Si substrate 122. A cavity 124 is formed in the approximately central portion of the Si substrate 122 preferably by anisotropic etching, to form the $SiO_2$ thin film 123. An AlN piezoelectric thin film 126A is disposed on the $SiO_2$ thin film support portion 125, a ZnO piezoelectric thin film 126Z is disposed thereon, and, furthermore, a AlN piezoelectric thin film 126A is disposed thereon, to define a piezoelectric laminate 128 including the AlN piezoelectric thin film 126A, in a lower layer, the ZnO piezoelectric thin film 126Z, and the AlN piezoelectric thin film 126A, in an upper layer, on the thin film support portion 125. Then, excitation electrodes 127b and 127a are disposed, respectively, on an upper surface of the AlN piezoelectric thin film 126A, in an upper layer, and on a lower surface of the ZnO piezoelectric thin film 126Z.

In the piezoelectric thin film resonator 138 having such a unique structure, by properly adjusting each film thickness ratio of the SiO$_2$ thin film support portion 125, the AlN piezoelectric thin film 126A, in the upper layer, and the ZnO piezoelectric thin film 126Z, the temperature coefficient of resonant frequency becomes nearly zero, and temperature characteristics become very stable.

In the piezoelectric thin film resonator 138, because the AlN piezoelectric thin film 126A, in the upper layer, and the ZnO piezoelectric thin film 126Z is held between the excitation electrodes 127a and 127b, when an electric signal is applied to the AlN piezoelectric thin film 126A, in the upper layer, and the ZnO piezoelectric thin film 126Z, via the excitation electrodes 127a and 127b, elastic vibrations are generated in the AlN piezoelectric thin film 126A, in the upper layer, and the ZnO piezoelectric thin film 126Z. As a result, a very large resonant response is obtained and very strong resonant characteristics are realized. On the other hand, the AlN piezoelectric thin film 126A, in the lower layer, is located not between the excitation electrodes 127a and 127b. However, when a signal voltage is applied to the excitation electrodes 127a and 127b, the AlN piezoelectric thin film 126A, in the lower layer, is also supplied with a voltage, by dielectric polarization, to contribute to the improvement of resonant characteristics of the piezoelectric thin film resonator 138.

Furthermore, the etching operation can be performed easily due to the SiO$_2$ thin film support portion 125. Also, the piezoelectric thin film resonator 138 can be used with high frequencies due to the very small total film thickness of the piezoelectric laminate 128 and the SiO$_2$ thin film support portion 125, and the design flexibility is very high due to an increase of material parameters.

FIG. 35 is a sectional view of a piezoelectric thin film resonator 139 according to a twenty-eighth preferred embodiment of the present invention. In the piezoelectric thin film resonator 139, having a similar arrangement of the thin film support portion 125, and the piezoelectric laminate 128 as in the twenty-seventh preferred embodiment (FIG. 34), excitation electrodes 127b and 127a are disposed, respectively, on an upper surface of the ZnO piezoelectric thin film 126Z and a lower surface of the AlN piezoelectric thin film 126A, in the lower layer.

In the piezoelectric thin film resonator 139 having such a unique structure, the temperature coefficient of resonant frequency becomes nearly zero, and temperature characteristics become stable. The AlN piezoelectric thin film 126A, in the upper layer, is not located between the excitation electrodes 127a and 127b. However, when a signal voltage is applied to the excitation electrodes 127a and 127b, the AlN piezoelectric thin film 126A is also supplied with a voltage, by dielectric polarization, to contribute to the improvement of resonant characteristics of the piezoelectric thin film resonator 139.

Furthermore, the piezoelectric thin film resonator 139 having the thin film is formed from the SiO$_2$ thin film 123, similarly to the piezoelectric thin film resonator 138 according to a twenty-seventh preferred embodiment, achieves the advantages including the etching operation of the Si substrate 122 being performed easily, very high design flexibility, using the resonator with high frequencies.

Figure 36:
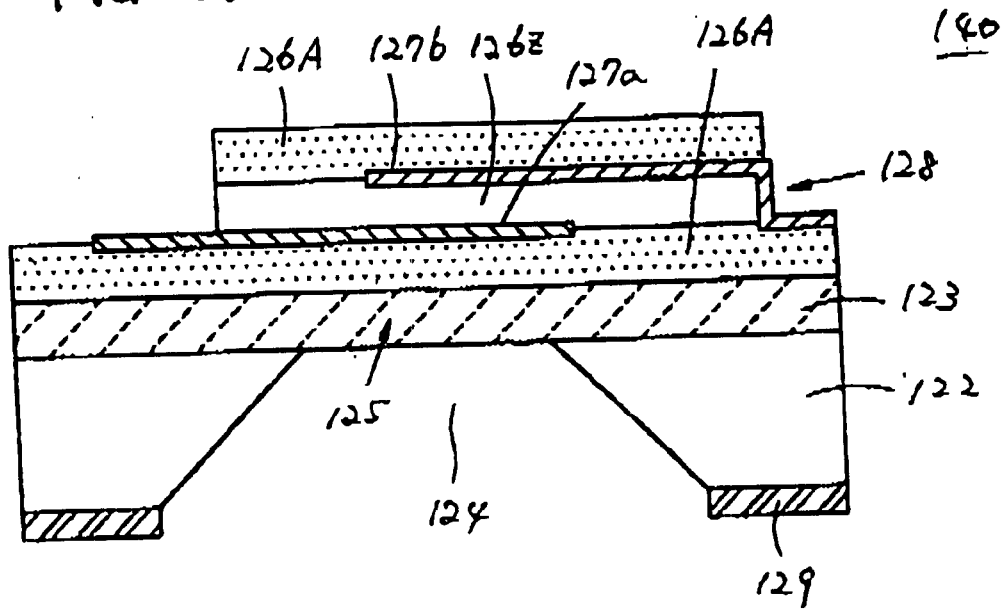
FIG. 36 is a sectional view of a piezoelectric thin film resonator according to a twenty-ninth preferred embodiment of the present invention.

FIG. 36 is a sectional view of a piezoelectric thin film resonator 140 according to a twenty-ninth preferred embodiment of the present invention. In the piezoelectric thin film resonator 140, having a similar arrangement of the SiO$_2$ thin film support portion 125, and the piezoelectric laminate 128 as in the twenty-seventh preferred embodiment (FIG. 34), excitation electrodes 127b and 127a are disposed on an upper surface and a lower surface of the ZnO piezoelectric thin film 126Z.

In the piezoelectric thin film resonator 140 having such a unique structure, the temperature coefficient of resonant frequency becomes nearly zero, and temperature characteristics become stable. Both the AlN piezoelectric thin film 126A, and 126A, in the upper layer and in the lower layer, are not located between the excitation electrodes 127a and 127b. However, when a signal voltage is applied to the excitation electrodes 127a and 127b, the upper and lower AlN piezoelectric thin films 126A are also supplied with a voltage, by dielectric polarization, to contribute to the improvement of resonant characteristics of the piezoelectric thin film resonator 140.

Furthermore, the piezoelectric thin film resonator 140 having the lowest thin film formed from the SiO$_2$ thin film 123, has advantages that the etching operation of the Si substrate 122 can be performed easily, the design flexibility is very high, and it is possible to be used with high frequencies.

This preferred embodiment holds only one piezoelectric layer between the excitation electrodes 127a and 127b, and, in the figure, only the ZnO piezoelectric thin film 126Z is held between the excitation electrodes 127a and 127b, it is possible to hold only the AlN piezoelectric thin film 126A between the excitation electrodes 127a and 127b.

Figure 37:
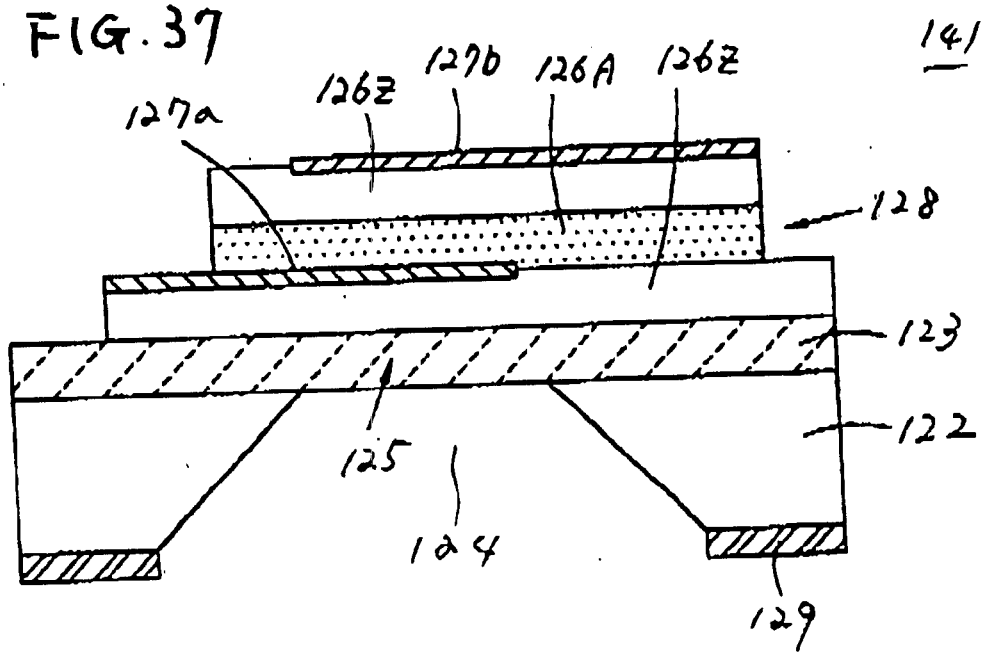
FIG. 37 is a sectional view of a piezoelectric thin film resonator according to a thirtieth preferred embodiment of the present invention.

FIG. 37 is a sectional view of a piezoelectric thin film resonator 141 according to a thirtieth preferred embodiment of the present invention. In the piezoelectric thin film resonator 141, a SiO$_2$ thin film 123 is disposed on a Si substrate 122. A cavity 124 is formed in the approximately central portion of the Si substrate 122 preferably by anisotropic etching, to form the SiO$_2$ thin film 123. A ZnO piezoelectric thin film 126z is disposed on the SiO$_2$ thin film support portion 125, an AlN piezoelectric thin film 126A is disposed thereon, and, furthermore, a ZnO piezoelectric thin film 126Z is disposed thereon, to define a piezoelectric laminate 128 including the ZnO piezoelectric thin film 126Z, in a lower layer, the AlN piezoelectric thin film 126A, and the ZnO piezoelectric thin film 126Z, in an upper layer, on the thin film support portion 125. Then, excitation electrodes 127b and 127a are disposed, respectively, on an upper surface of the ZnO piezoelectric thin film 126Z, in the upper layer, and on a lower surface of the AlN piezoelectric thin film 126A.

In the piezoelectric thin film resonator 141 having such a unique structure, by properly adjusting each film thickness ratio of the SiO$_2$ thin film support portion 125, the ZnO piezoelectric thin film 126Z, in the lower layer, the AlN piezoelectric thin film 126A, and the ZnO piezoelectric thin film 126Z, in the upper layer, the temperature coefficient of resonant frequency becomes nearly zero and temperature characteristics become stable.

In the piezoelectric thin film resonator 141, because the ZnO piezoelectric thin film 126Z, in the upper layer, and the AlN piezoelectric thin film 126A is held between the excitation electrodes 127a and 127b, when an electric signal is applied to the ZnO piezoelectric thin film 126Z, in the upper layer, and the AlN piezoelectric thin film 126A, via the excitation electrodes 127a and 127b, elastic vibrations are generated in the ZnO piezoelectric thin film 126z, in the upper layer, and the AlN piezoelectric thin film 126A. As a result, a very large resonant response is obtained and very strong resonant characteristics are achieved. On the other hand, the ZnO piezoelectric thin film 126Z, in the lower layer, is not located between the excitation electrodes 127a and 127b. However, since ZnO is a piezoelectric material, when a signal voltage is applied to the excitation electrodes 127a and 127b, the ZnO piezoelectric thin film 126Z, in the upper layer, is also supplied with a voltage, by dielectric polarization, to contribute to the improvement of resonant characteristics of the piezoelectric thin film resonator 141.

Furthermore, the etching operation can be performed easily due to the SiO$_2$ thin film support portion 125, the piezoelectric thin film resonator 141 can be used with high frequencies due to the very small total film thickness of the piezoelectric laminate 128 and the SiO$_2$ thin film support portion 125 thin, and the design flexibility is very high due to an increase of material parameters.

FIG. 38 is a sectional view of a piezoelectric thin film resonator 142 according to a thirty-first preferred embodiment of the present invention. In the piezoelectric thin film resonator 142, having a similar arrangement of the thin film support portion 125, and the piezoelectric laminate 128 as in the thirtieth preferred embodiment (FIG. 37), excitation electrodes 127b and 127a are disposed, respectively, on an upper surface of the AlN piezoelectric thin film 126A and a lower surface of the ZnO piezoelectric thin film 126Z, in the lower layer.

In the piezoelectric thin film resonator 142 having such a unique structure, the temperature coefficient of resonant frequency becomes nearly zero, and temperature characteristics become stable. The ZnO piezoelectric thin film 126Z, in the upper layer, is not located between the excitation electrodes 127a and 127b. However, when a signal voltage is applied to the excitation electrodes 127a and 127b, the ZnO piezoelectric thin film 126Z is also supplied with a voltage, by dielectric polarization, to contribute to the improvement of resonant characteristics of the piezoelectric thin film resonator 142.

Furthermore, the piezoelectric thin film resonator 142, wherein the SiO$_2$ thin film 123 is formed, similarly to the piezoelectric thin film resonator 141 according to a thirtieth preferred embodiment, has advantages that the etching operation of the Si substrate 122 can be performed easily, the design flexibility is very high, and it is possible to be used with high frequencies.

FIG. 39 is a sectional view of a piezoelectric thin film resonator 143 according to a thirty-second preferred embodiment of the present invention. In the piezoelectric thin film resonator 143, having a same arrangement of the SiO$_2$ thin film support portion 125, and the piezoelectric laminate 128 as in the thirtieth preferred embodiment (FIG. 37), excitation electrodes 127b and 127a are disposed on an upper surface and a lower surface of the AlN piezoelectric thin film 126A.

In the piezoelectric thin film resonator 143, having such a structure, the temperature coefficient of resonant frequency becomes nearly zero and temperature characteristics become stable. Both the ZnO piezoelectric thin films 126Z, in the upper layer and lower layer, are not located between the excitation electrodes 127a and 127b. However, when a signal voltage is applied to the excitation electrodes 127a and 127b, the upper and lower ZnO piezoelectric thin films 126Z are also supplied with a voltage, by dielectric polarization, to contribute to the improvement of resonant characteristics of the piezoelectric thin film resonator 143.

Furthermore, the piezoelectric thin film resonator 143, wherein the SiO$_2$ thin film 123 is provided, has advantages that the etching operation of the Si substrate 122 can be performed easily, the design flexibility is very high, and it is possible to be used with high frequencies.

This preferred embodiment holds only one piezoelectric layer between the excitation electrodes 127a and 127b, and, in FIG. 39, only the AlN piezoelectric thin film 126A is held between the excitation electrodes 127a and 127b. It is possible to hold only the upper or lower piezoelectric thin film 126Z between the excitation electrodes 127a and 127b.

Figure 40:
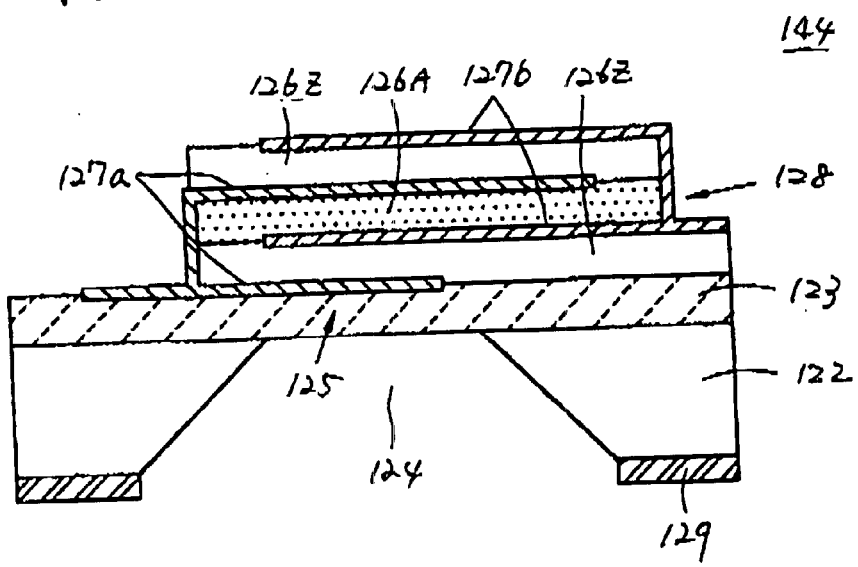
FIG. 40 is a sectional view of a piezoelectric thin film resonator according to a thirty-third preferred embodiment of the present invention.

FIG. 40 is a sectional view of a piezoelectric thin film resonator 144 according to a thirty-third preferred embodiment of the present invention. In the piezoelectric thin film resonator 144, a SiO$_2$ thin film 123 is disposed on a Si substrate 122. A cavity 124 is formed in the approximately central portion of the Si substrate 122 preferably by anisotropic etching, to form the SiO$_2$ thin film support portion 125 from the SiO$_2$ thin film 123. A ZnO piezoelectric thin film 126z is disposed on the SiO$_2$ thin film support portion 125, an AlN piezoelectric thin film 126A is disposed thereon, and, furthermore, a ZnO piezoelectric thin film 126Z is disposed thereon, to define a piezoelectric laminate 128 including the ZnO piezoelectric thin film 126Z, in a lower layer, the AlN piezoelectric thin film 126A, and the ZnO piezoelectric thin film 126Z, in an upper layer, on the thin film support portion 125. Then, excitation electrodes 127a are disposed, respectively, on a boundary of the ZnO piezoelectric thin film 126Z, in the upper layer, and the AlN piezoelectric thin film 126A, and on a lower surface of the ZnO piezoelectric thin film 126Z, in the lower layer, and are arranged to be continuous with each other. Excitation electrodes 127b are disposed, respectively, on the upper surface of the ZnO piezoelectric thin film 126Z, in the upper layer, and on a boundary of the AlN piezoelectric thin film 126A and the ZnO piezoelectric thin film 126Z, in the lower layer, and are arranged to be continuous with each other.

In the piezoelectric thin film resonator 144 having such a unique structure, the ZnO piezoelectric thin film 126Z, in the upper layer, the AlN piezoelectric thin film 126A, and the ZnO piezoelectric thin film 126Z, in the lower layer, are connected in parallel. Therefore, when an electric signal is applied to each piezoelectric thin film 126A and 126Z, via the excitation electrodes 127a and 127b, elastic vibrations are generated in all piezoelectric thin films 126Z, 126A, and 126Z. As a result, a very large resonant response is obtained and very strong resonant characteristics are achieved.

In the laminate having such a three-layer structure, by properly adjusting each film thickness ratio of the thin film support portion 125, the ZnO piezoelectric thin film 126Z, in the lower layer, the AlN piezoelectric thin film 126A, and the ZnO piezoelectric thin film 126Z, in the upper layer, the temperature coefficient of resonant frequency becomes nearly zero, and temperature characteristics become very stable.

Furthermore, the piezoelectric thin film resonator 144 having such a unique structure, wherein the lowest thin film is formed from the SiO$_2$ thin film 123, has advantages that the etching operation of the Si substrate 122 can be performed easily, the design flexibility is very high, and it is possible to be used with high frequencies.

The preferred embodiment, explained here, is one example, and, of course, in the piezoelectric laminate, having other arrangements, the excitation electrodes 127a and 127b may be arranged to have three layers or more.

Figure 41:
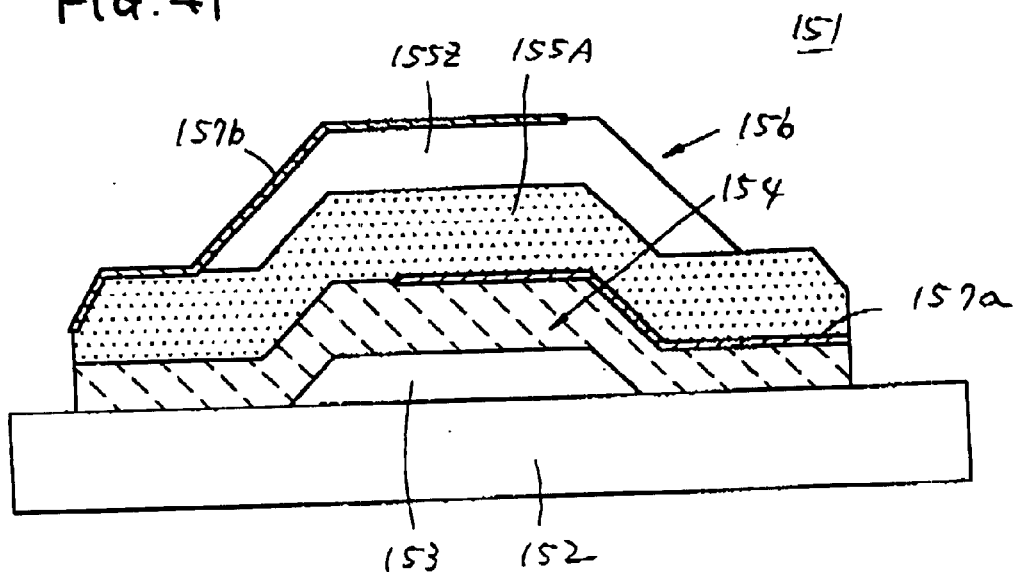
FIG. 41 is a sectional view of a piezoelectric thin film resonator according to a thirty-fourth preferred embodiment of the present invention.

FIG. 41 is a sectional view of a piezoelectric thin film resonator 1151 according to a thirty-fourth preferred embodiment of the present invention. This is the piezoelectric thin film resonator 1151, having an air bridge construction. A thin film support portion 154 made of SiO$_2$, is disposed on a glass substrate 152, via an air gap 153, and a piezoelectric laminate 156 made of an AlN piezoelectric thin film 155A and a ZnO piezoelectric thin film 155Z, is disposed on the thin film support portion 154. Then, excitation electrodes 157b and 157a are disposed on an upper surface and a lower surface of the piezoelectric laminate 156 including the ZnO piezoelectric thin film 155Z and the AlN piezoelectric thin film 155A.

Thus, excitation electrodes 157b and 157a are disposed on both sides of a vibration portion defined by the ZnO piezoelectric thin film 155Z and the AlN piezoelectric thin film 155A, and when an electric signal is applied, thickness mode vibrations are generated.

FIGS. 42A to 42G are figures illustrating a method of manufacturing of the aforementioned piezoelectric thin film resonator 151. A sacrifice layer 158, preferably made of ZnO, is formed, preferably by sputtering, on a glass substrate 152, and the sacrifice layer 158 is etched leaving behind a portion corresponding to an air gap 153, as shown in FIG. 42A. Then, the thin film support portion 154 is formed from SiO$_2$ on the sacrifice layer 158 by reactive sputtering method, as seen in FIG. 42B.

Thereafter, the excitation electrode 157a is formed from Al preferably by a lift-off vapor deposition method, on the thin film support portion 154, as seen in FIG. 42C. The piezoelectric thin film 155A made of AlN, is disposed on the thin film support portion 154 and the excitation electrode 157a preferably by reactive sputtering method, as seen in FIG. 42D.

The sacrifice layer 158 is etched with an aqueous solution of acetic acid, and the air gap 153 is located on the lower surface of the thin film support portion 154 to float the thin film support portion 154 above an upper surface of glass substrate 152, as seen in FIG. 42E. At this time, because the thin film support portion 154 made of SiO$_2$, is not etched with etching liquids such as CH$_3$COOH, a process, to float the thin film support portion 154 above the glass substrate 152, can be easily conducted, as seen in FIG. 42F. The sacrifice layer 158 may be removed, by etching, before formation of the AlN piezoelectric thin film 155A.

Then, the ZnO piezoelectric thin film 155Z is disposed on the upper surface of the AlN piezoelectric thin film 155A by the sputtering method, as seen in FIG. 42F, the excitation electrode 157b is formed on the ZnO piezoelectric thin film 155Z by the vacuum evaporation method using a metal mask, as seen in FIG. 42G. Thus, the piezoelectric thin film resonator 151 having a floating construction, shown in FIG. 41, is manufactured.

The temperature coefficient of resonant frequency of ZnO has a negative value, the temperature coefficient of resonant frequency of AlN has a positive value. Therefore, in the piezoelectric thin film resonator 151, wherein the AlN piezoelectric thin film 155A and the ZnO piezoelectric thin film 155Z are disposed on the thin film support portion 154, having a floating construction, the temperature coefficient of resonant frequency becomes nearly zero by properly adjusting a film thickness ratio of the thin film support portion 154, the ZnO piezoelectric thin film 155Z, and the AlN piezoelectric thin film 155A.

Furthermore, in the piezoelectric thin film resonator 151, because the ZnO piezoelectric thin film 155Z and the AlN piezoelectric thin film 155A are both piezoelectric materials, when an electric signal is applied to the ZnO piezoelectric thin film 155Z and the AlN piezoelectric thin film 155A, via the excitation electrodes 157a and 157b, elastic vibrations are generated in both piezoelectric thin films 155A and 155Z. As a result, a very large resonant response is obtained and very strong resonant characteristics are realized.

Because the temperature coefficient of resonant frequency of SiO$_2$ is greater than the temperature coefficient of resonant frequency of AlN, in order to offset the temperature coefficient of resonant frequency of ZnO, by using the SiO$_2$ thin film support portion 154 together, a total film thickness of the piezoelectric laminate 156 and the SiO$_2$ thin film support portion 154 can be very small, and the piezoelectric thin film resonator 151 can be used with high frequencies, rather than a case in which the AlN piezoelectric thin film 155A is used alone.

Furthermore, since there are three material parameters, i.e., the SiO$_2$ thin film support portion 154 being an insulator, the AlN piezoelectric thin film 155A, and the ZnO piezoelectric thin film 155Z, it becomes possible to adjust characteristics, other than the temperature coefficients of resonant frequency and the resonant characteristics, for example, the electromechanical coefficient, and others, so as to make the design flexibility high.

According to the piezoelectric thin film resonator 151 having such a unique floating construction, as it is not necessary to remove by the etching, the lower surface of the substrate 152, there is an advantage that it is not necessary to limit the substrates of specialized materials such as a glass substrate.

Also, in the piezoelectric thin film resonator 151 according to this preferred embodiment, ZnO and AlN may be exchanged with each other, the ZnO piezoelectric thin film 155Z may be disposed on the thin film support portion 154, and the AlN piezoelectric thin film 155A may be disposed thereon.

Various preferred embodiments, relating to diaphragm type piezoelectric thin film resonators, have been explained above. With respect to piezoelectric thin film resonators having floating construction, various other preferred embodiments, such as a resonator wherein more than three layers are provided on a thin film support portion, a resonator wherein only a portion of a thin film, constituting a piezoelectric laminate, is held between excitation electrodes, and a resonator wherein a combination of piezoelectric materials are changed, are possible.

Figure 43:
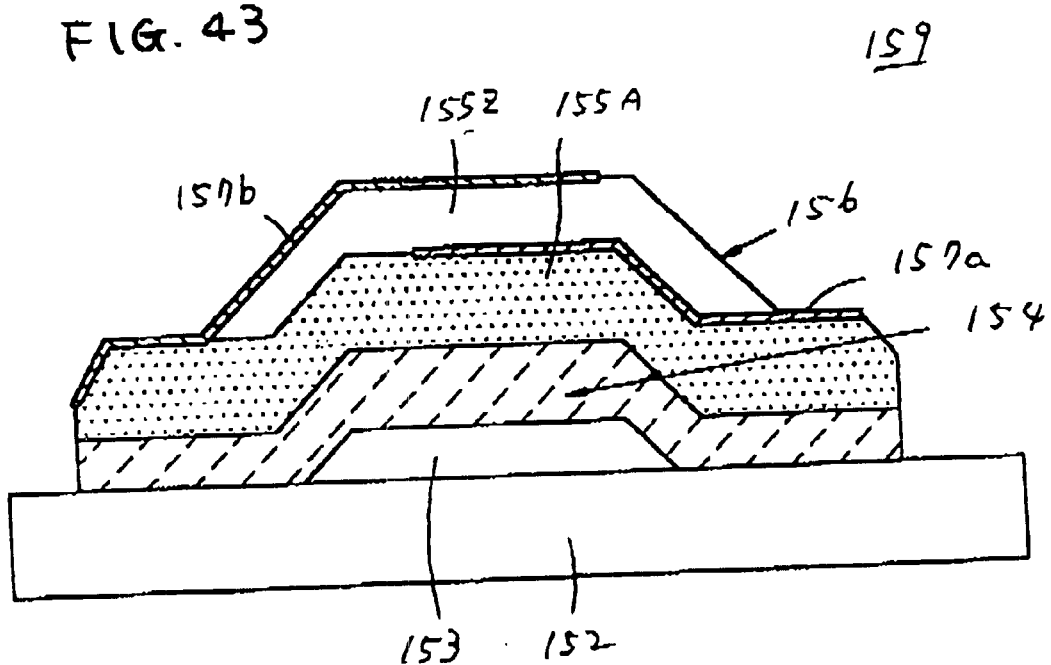
FIG. 43 is a sectional view of a piezoelectric thin film resonator according to a thirty-fifth preferred embodiment of the present invention.

For example, FIG. 43 is a sectional view of a piezoelectric thin film resonator 159 according to a thirty-fifth preferred embodiment of the present invention, showing a different preferred embodiment of the piezoelectric thin film resonator 159, having a floating construction. In the piezoelectric thin film resonator 159, a SiO$_2$ thin film support portion 154, having a floating construction, is disposed on a glass substrate 152 via an air gap 153, a AlN piezoelectric thin film 155A is disposed on the thin film support portion 154, and a ZnO piezoelectric thin film 155Z is disposed thereon. Then excitation electrodes 157b and 157a are disposed on an upper surface and a lower surface of the ZnO piezoelectric thin film 155Z.

In the piezoelectric thin film resonator 159, because the ZnO piezoelectric thin film 155Z is held between the excitation electrodes 157a and 157b, when an electric signal is applied to the ZnO piezoelectric thin film 155Z, via the excitation electrodes 157a and 157b, an elastic vibration is generated in the ZnO piezoelectric thin film 155Z. As a result, a resonant response is achieved. On the other hand, the AlN piezoelectric thin film 155A is not located between the excitation electrodes 157a and 157b. However, when a signal voltage is applied to the excitation electrodes 157a and 157b, the AlN piezoelectric thin film 155A is also supplied with a voltage, by dielectric polarization, to improve resonant characteristics of the piezoelectric thin film resonator 159.

Therefore, in this preferred embodiment, the piezoelectric thin film resonator 159 achieves very stable temperature characteristics of resonant frequency and very strong resonant characteristics.

Furthermore, the piezoelectric thin film resonator 159, having such a unique structure, similarly to the thirty-fourth preferred embodiment, has advantages that the design flexibility is very high, and it is possible to be used with high frequencies.

Figure 44:
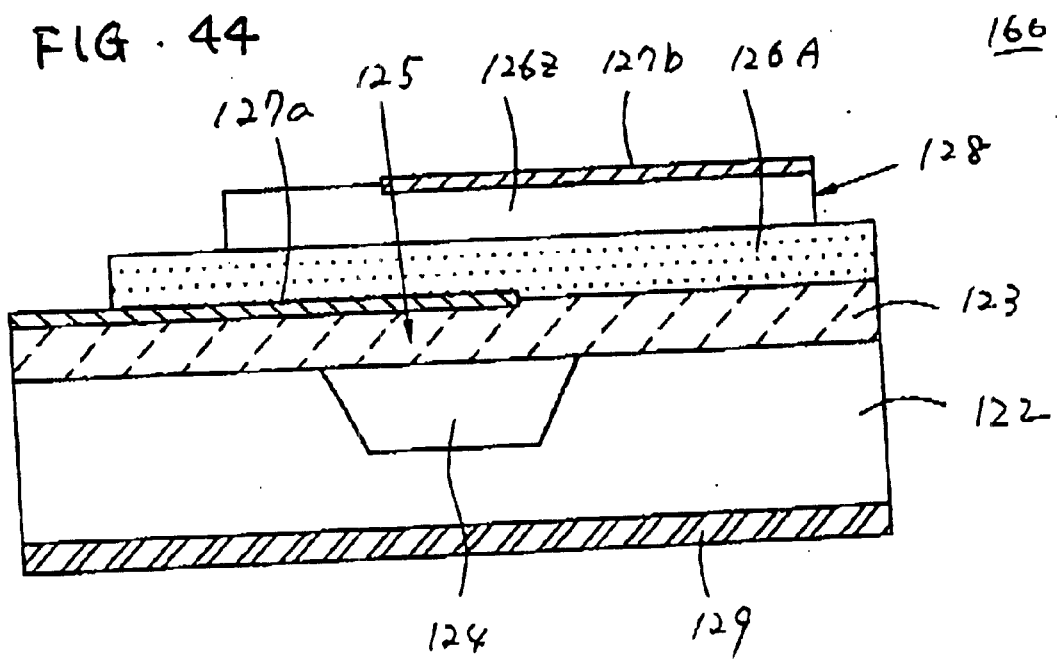
FIG. 44 is a sectional view of a piezoelectric thin film resonator according to a thirty-sixth preferred embodiment of the present invention.

FIG. 44 is a sectional view, illustrating a structure, of a piezoelectric thin film resonator 160 according to a thirty-sixth preferred embodiment of the present invention. In this preferred embodiment, a cavity 124 is formed on an upper surface of the Si substrate 122, by etching the upper surface of the Si substrate 122, and a $SiO_2$ film 123 (a thin film support portion 125) as an insulator film, an excitation electrode 127a, an AlN piezoelectric thin film 126A, a ZnO piezoelectric thin film 126Z, and an excitation electrode 127b are disposed on the Si substrate 122. A $SiO_2$ film 129 is disposed on a lower surface of the Si substrate 122. A manufacturing procedure is as follows. After forming the $SiO_2$ film 123 on the Si substrate 122, an etching liquid is injected into the upper surface of the Si substrate 122 through an opening provided in the $SiO_2$ film 123, to form the cavity 124 by etching a portion of the Si substrate 122, under the opening of the $SiO_2$ film 123. Then the excitation electrode 127a, the AlN piezoelectric thin film 126A, the ZnO piezoelectric thin film 126Z, and the excitation electrode 126b are formed, in order, on the $SiO_2$ film 123.

This preferred embodiment corresponds to the resonator according to the nineteenth preferred embodiment, wherein the cavity 124 is not formed from the lower surface of the substrate, but from the surface of the substrate. Such a piezoelectric resonator 130 achieves advantages similar to the nineteenth preferred embodiment. Furthermore, in this preferred embodiment, according to combinations of piezoelectric films and electrodes, other preferred embodiments corresponding to the twentieth preferred embodiment to the thirty-fourth preferred embodiment, are possible.

Figure 45A:
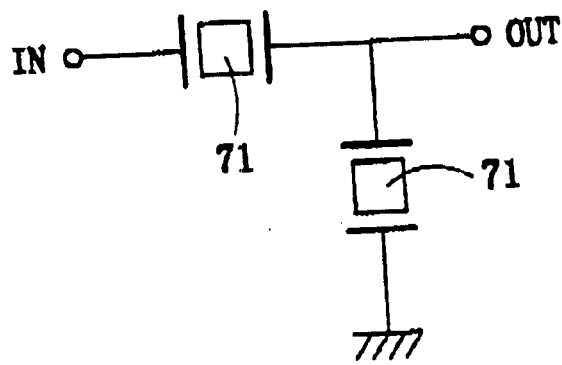
FIGS. 45A to 45C are circuit diagrams respectively showing an L-type filter, a T-type filter and a π-type filter which uses resonators according to any of the first to thirty-sixth preferred embodiments of the present invention.
Figure 45B:
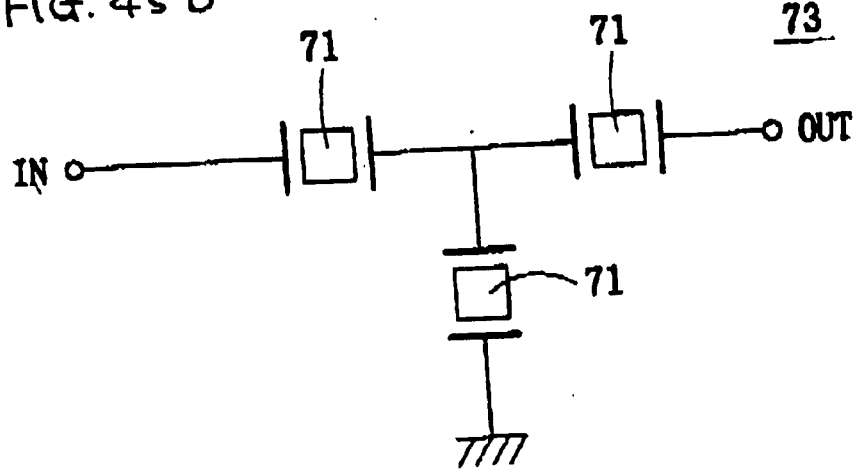
Figure 45C:
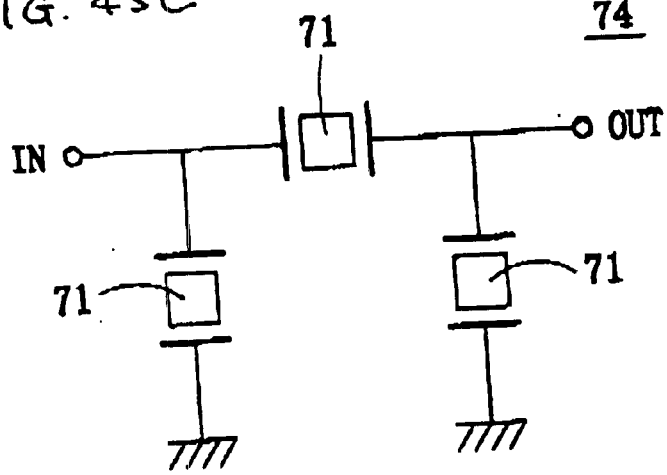

FIGS. 45A to 45C are circuit diagrams showing filters 72 to 74 according to the present preferred embodiment. The filters 72 to 74 includes two or more piezoelectric resonators 71 according to any of the first to thirty-sixth preferred embodiments, and the piezoelectric resonators 71 are connected to define a ladder circuit.

More specifically, in the filter 72 shown in FIG. 45A, one piezoelectric filter 71 is connected between an input terminal and an output terminal to define a series arm and another piezoelectric resonator 71 is connected between the series arm and a ground level, thereby defining an L-type ladder filter.

In the filter 73 shown in FIG. 45B, two piezoelectric resonators 71 are connected in series between an input terminal and an output terminal to define a series arm and another piezoelectric resonator 71 is connected between the series arm and aground level, thereby defining a T type ladder filter.

In the filter 74 shown in FIG. 45C, one piezoelectric filter 71 is connected between an input terminal and an output terminal to define a series arm and other two piezoelectric resonator 71 are connected between the series arm and a ground level, thereby defining a π type ladder filter.

The filters 72 to 74 have excellent temperature characteristics as the resonators 71 have a stable temperature characteristic of a resonant frequency. In the case where the resonator 71 according to the nineteenth to thirty-sixth preferred embodiments are included in the filters 72 to 74, the filters 72 to 74 easily endure external forces that have high mechanical strength.

It is noted that the piezoelectric resonators and filters according to the preferred embodiment can be applied to various electronic apparatus such as a cellular phones, personal computers, and so on.

In the aforementioned preferred embodiments, resonators using piezoelectric materials, combining the ZnO and the AlN, are explained. In addition to this, combinations of piezoelectric materials, having negative temperature coefficients of resonant frequency, such as ZnO, $LiNbO_3$, $LiTaO_3$, and $PbZr_xTi_{(1-x)}O_3$, wherein $0.54 \leq x \leq 0.152$, and piezoelectric materials, having positive temperature coefficients of resonant frequency, such as AlN, and $PbZr_xTi_{(1-x)}O_3$, wherein $0.54 \leq x \leq 1$ may be used. The lowest thin film and thin film support portion may be formed from SiN or other suitable material.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric resonator comprising:
   a laminated structure including at least one first piezoelectric layer which has a positive temperature coefficient of a resonant frequency and at least one second piezoelectric layer which has a negative temperature coefficient of a resonant frequency;
   at least a pair of electrodes interposing at least one of the first and second piezoelectric layers; and
   a substrate supporting the laminated structure and holding a portion of the laminated structure such that the holding portion vibrates by applying a voltage across the pair of electrodes.

2. A piezoelectric resonator according to claim 1, wherein the pair of electrodes interpose the at least one first piezoelectric layer and the at least one second piezoelectric layer.

3. A piezoelectric resonator according to claim 1, wherein the at least one first piezoelectric layer includes as a primary component one of AlN and $PbZr_xTi_{(1-x)}O_3$ ($0.54 \leq x \leq 1$).

4. A piezoelectric resonator according to claim 1, wherein the at least one second piezoelectric layer includes as a primary component one piezoelectric material selected from the group consisting of ZnO, $LiNbO_3$, $LiTaO_3$, and $PbZr_xTi_{(1-x)}O_3$ ($0 \leq x \leq 0.52$).

5. A piezoelectric resonator according to claim 1, wherein a thickness of the at least one first piezoelectric layer and a thickness of the at least one second piezoelectric layer are such that a temperature coefficient of a resonant frequency of the piezoelectric laminate is substantially zero.

6. A piezoelectric resonator according to claim 1, wherein the substrate has a frame shape having an opening, and the holding portion of the laminated structure is positioned above the opening.

7. A piezoelectric resonator according to claim 1, wherein the laminated structure has an air-bridge structure in which the holding portion of the laminated structure is spaced apart from the substrate.

8. A piezoelectric resonator according to claim 1, wherein the piezoelectric laminate includes an additional first piezoelectric layer, the additional first piezoelectric layer and the at least one first piezoelectric layer have substantially the same thickness and interpose the at least second piezoelectric layer.

9. A piezoelectric resonator according to claim 1, wherein the piezoelectric laminate includes an additional second piezoelectric layer, the additional second piezoelectric layer and the at least one second piezoelectric layer have substantially the same thickness and interpose the at least first piezoelectric layer.

10. A piezoelectric resonator according to claim 1, wherein the laminated structure includes an insulating layer between the substrate and the piezoelectric laminate.

11. A piezoelectric resonator according to claim 10, wherein the pair of electrodes interpose the at least one first piezoelectric layer and the at least one second piezoelectric layer.

12. A piezoelectric resonator according to claim 10, wherein the at least one first piezoelectric layer includes as a primary component one of AlN and $PbZr_xTi_{(1-x)}O_3$ ($0.54 \leq x \leq 1$).

13. A piezoelectric resonator according to claim 10, wherein the at least one second piezoelectric layer includes as a primary component, one piezoelectric material selected from the group consisting of ZnO, $LiNbO_3$, $LiTaO_3$, and $PbZr_xTi_{(1-x)}O_3$ ($0 \leq x \leq 0.52$).

14. A piezoelectric resonator according to claim 10, wherein a thickness of the at least one first piezoelectric layer, a thickness of the at least one second piezoelectric layer and a thickness of the insulating layer are such that a temperature coefficient of a resonant frequency of the piezoelectric laminate is substantially zero.

15. A piezoelectric resonator according to claim 10, wherein the substrate has a frame shape having an opening, and the holding portion of the laminated structure is positioned above the opening.

16. A piezoelectric resonator according to claim 10, wherein the laminated structure has an air-bridge structure in which the holding portion of the laminated structure is spaced apart from the substrate.

17. A filter comprising:

an input terminal;

an output terminal;

first and second piezoelectric resonators each including:
    a laminated structure including at least one first piezoelectric layer which has a positive temperature coefficient of a resonant frequency and at least one second piezoelectric layer which has a negative temperature coefficient of a resonant frequency;
    at least a pair of electrodes interposing at least one of the first and second piezoelectric layers; and
    a substrate supporting the laminated structure and holding a portion of the laminated structure such that the holding portion vibrates by applying a voltage across the pair of electrodes;

wherein the first piezoelectric resonator is connected between the input terminal and the output terminal to define a series arm and the second piezoelectric resonator is connected between the series arm and a ground level to define a series arm.

18. A filter according to claim 17, wherein the filter is one of a T-type ladder filter, an L-type ladder filter and a π-type ladder filter.

19. An electronic apparatus comprising at least one piezoelectric resonator according to claim 1.

20. An electronic apparatus according to claim 17, wherein the apparatus includes at least one of a T-type ladder filter, an L-type ladder filter and a π-type ladder filter.

* * * * *